United States Patent
Nakashima et al.

(10) Patent No.: US 9,496,158 B2
(45) Date of Patent: Nov. 15, 2016

(54) PROCESSING APPARATUS

(75) Inventors: Mikio Nakashima, Koshi (JP); Hiroaki Inadomi, Koshi (JP); Satoshi Okamura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 995 days.

(21) Appl. No.: 13/447,519

(22) Filed: Apr. 16, 2012

(65) Prior Publication Data

US 2012/0266925 A1    Oct. 25, 2012

(30) Foreign Application Priority Data

Apr. 20, 2011  (JP) ................... 2011-094002
Nov. 25, 2011  (JP) ................... 2011-257752
Jan. 17, 2012  (JP) ................... 2012-007237

(51) Int. Cl.
    *H01L 21/67*         (2006.01)
(52) U.S. Cl.
    CPC ..... *H01L 21/67126* (2013.01); *H01L 21/6719* (2013.01)
(58) Field of Classification Search
    CPC ............... H01L 21/67017; H01L 21/67023; H01L 21/67028; H01L 21/67051; H01L 21/67057; H01L 21/6708; F27B 17/0025; F27B 17/0019; F27D 5/0037; F27D 3/0084; F16K 51/02
    USPC ............ 134/61, 62, 184, 198, 902; 414/935, 414/936, 937, 939, 940, 941
    See application file for complete search history.

(56) References Cited

U.S. PATENT DOCUMENTS

| | | | | |
|---|---|---|---|---|
| 4,574,974 A | * | 3/1986 | von Holdt | B65D 1/46 220/782 |
| 5,097,977 A | * | 3/1992 | Straub | B65D 43/0206 220/783 |
| 6,164,297 A | * | 12/2000 | Kamikawa | H01L 21/67051 134/200 |
| 7,105,061 B1 | * | 9/2006 | Shrinivasan | H01L 21/67126 118/715 |

(Continued)

FOREIGN PATENT DOCUMENTS

| JP | 10-47483 A | 2/1998 |
|---|---|---|
| JP | 2000-340540 A | 12/2000 |

(Continued)

*Primary Examiner* — Karla Moore
*Assistant Examiner* — Tinsae Ayalew
(74) *Attorney, Agent, or Firm* — Abelman, Frayne & Schwab

(57) ABSTRACT

Provided is a processing apparatus for performing a processing of a substrate to be processed using a high-pressure fluid to prevent the generation of particles and ensure airtightness in the processing container. A sealing member is installed to surround a carrying port of the processing chamber, the carrying port is closed by the cover, and the cover is restricted from retreating by the pressure in the processing chamber by a lock plate, thereby processing the wafer in the processing chamber using the high-pressure fluid. Since the sealing member is pressurized by the internal atmosphere of the processing chamber to be pressed toward the cover during the drying process, a gap between the cover and the processing chamber may be airtightly closed. Since the sealing member does not slide with respect to the processing chamber or the cover, the generation of particles is suppressed.

12 Claims, 21 Drawing Sheets

(56) References Cited

U.S. PATENT DOCUMENTS

| | | | | |
|---|---|---|---|---|
| 7,225,820 B2* | 6/2007 | Jones | ............... | H01L 21/67126 118/715 |
| 2002/0089124 A1* | 7/2002 | Hosokawa | ........... | F16J 15/3216 277/551 |
| 2008/0187430 A1* | 8/2008 | Datta | ............... | H01L 21/67126 414/805 |

FOREIGN PATENT DOCUMENTS

| JP | 2001-304419 A | 10/2001 |
|---|---|---|
| JP | 2003-056703 A | 2/2003 |
| JP | 2006-090463 A | 4/2006 |
| WO | 2010-032722 A | 3/2010 |

* cited by examiner

PROCESSING APPARATUS

CROSS-REFERENCE TO RELATED APPLICATIONS

This application is based on and claims priority from Japanese Patent Application Nos. 2011-094002, 2011-257752 and 2012-007237, filed on Apr. 20, 2011, Nov. 25, 2011 and Jan. 17, 2012, respectively, with the Japanese Patent Office, the disclosures of which are incorporated herein in their entirety by reference.

TECHNICAL FIELD

The present disclosure relates to a technology for performing a processing of a substrate to be processed using a high-pressure fluid in a processing container.

BACKGROUND

A single-wafer type spin cleaning apparatus cleaning a substrate to be processed, for example, a semiconductor wafer ("a wafer") removes dusts or native oxides on a wafer surface by rotating the wafer while supplying, for example, alkaline or acid chemical liquids to the wafer surface. The chemical liquid remaining on the wafer surface is removed by a rinsing process using, for example, deionized water (DIW), and subsequently, spin-drying for throwing off the remaining liquid by rotating the wafer is performed.

However, as the semiconductor devices are highly integrated, a problem of a so-called pattern collapse has increased in processing of removing, for example, the liquid. The pattern collapse is a phenomenon in which, when drying the remaining liquid on the wafer surface, the remaining liquid is unevenly dried at the left and right sides of, for example, a convex portion of concavo-convex portions forming a pattern so that the balance of the surface tension horizontally pulling the convex portion is lost, and as a result, the convex portion falls down in a direction in which more liquid remains.

As a technique of removing the liquid remaining on the water surface while preventing the occurrence of the pattern collapse, a drying method using a fluid in a supercritical state (a supercritical fluid) which is a kind of high-pressure fluid is known. The supercritical fluid has lower viscosity as compared to a liquid, and also has superior liquid dissolving capability. Further, there is no interface between the supercritical fluid and a liquid or a gas which is in an equilibrium state. Therefore, when the wafer having the liquid adhered thereon is substituted with the supercritical fluid, and thereafter the supercritical fluid is changed to a gaseous state, the liquid may be dried without being influenced by the surface tension.

However, in the case of performing the drying process, the pressure in a processing container is boosted to, for example, about 10 MPa. For this reason, a sealing structure that airtightly closes a wafer carrying port formed in a processing container by a cover is required to maintain airtightness even when the pressure in the processing container is changed and to further prevent the generation of particles.

Japanese Patent Application Laid-Open No. 10-47483 (FIG. 2 and paragraphs 0016 and 0017) suggests a technology that, in a sealing structure for sealing the inside of a can body by fastening a body flange and a lid flange with a clamp ring, a concave portion formed on the body flange and a convex projected portion formed on the lid flange interlock, and a packing of the convex projected portion contacts the concave portion to seal the inside of the can body. However, since the configuration of Japanese Patent Application Laid-Open No. 10-47483 has the sealing structure fastening the shell flange and the lid flange with the clamp ring, the sealing structure may not be applied to a configuration that airtightly closes a carrying port and a cover of a processing container as it is, and the problems of the present disclosure cannot be solved even by the configuration of Japanese Patent Application Laid-Open No. 10-47483.

SUMMARY

An exemplary embodiment of the present disclosure provides a processing apparatus including: a processing container configured to receive a substrate to be processed through a carrying port and process the substrate using a high-pressure fluid; a cover configured to close the carrying port; a sealing member annularly installed to surround the carrying port or fit to an inner circumferential surface of the carrying port when the carrying port is closed by the cover, having a U-shaped longitudinal cross section, and disposed such that an internal space surrounded in the U shape communicates with an internal atmosphere of the processing container; and a restriction mechanism configured to restrict the cover from retreating by the pressure in the processing container. In the processing apparatus, the sealing member is pressurized by the internal atmosphere of the processing container entering into the internal space to be pressed to at least one of the cover or the processing container, thereby airtightly closing a gap between the processing container and the cover.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
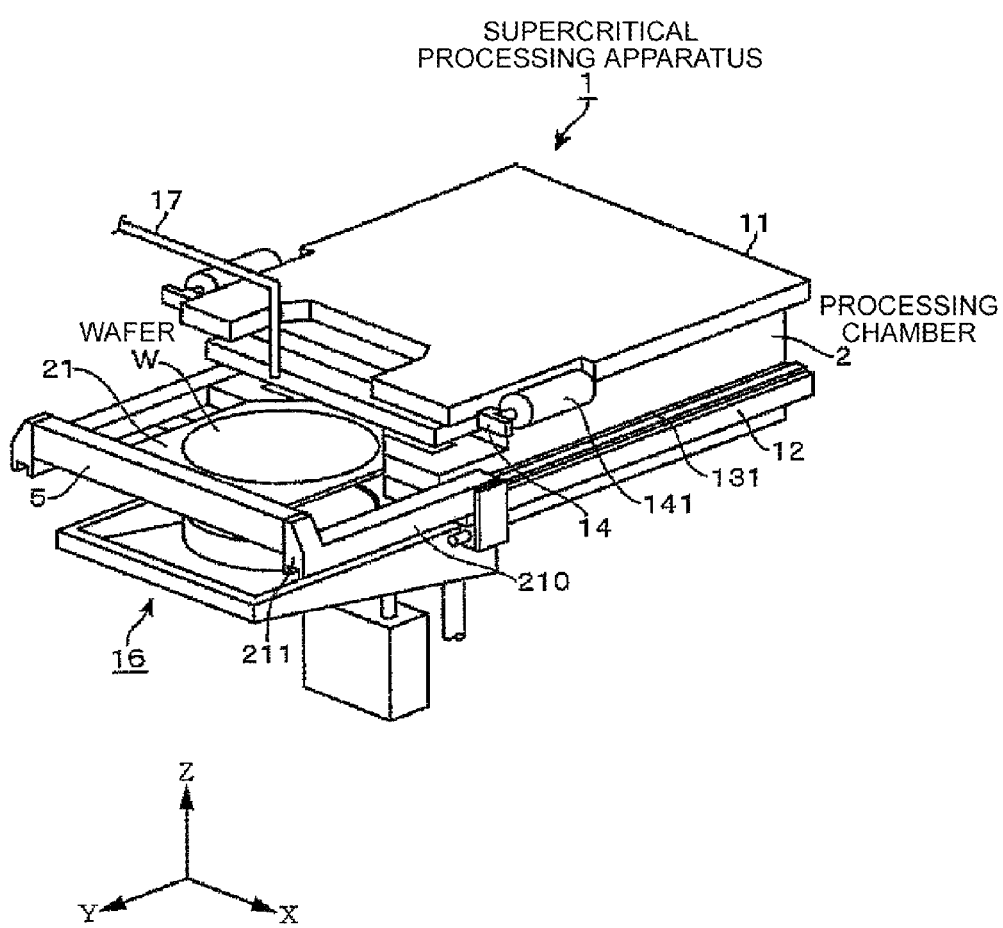
FIG. 1 is a perspective view illustrating a supercritical processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a processing apparatus that prevents the generation of particles and ensures airtightness of a processing container while performing a high-pressure fluid processing onto a substrate to be processed in the processing container.

An exemplary embodiment of the present disclosure provides a processing apparatus including: a processing container configured to receive a substrate to be processed through a carrying port and process the substrate using a high-pressure fluid; a cover configured to close the carrying port; a sealing member annularly installed to surround the carrying port or fit to an inner circumferential surface of the carrying port when the carrying port is closed by the cover, having a U-shaped longitudinal cross section, and disposed such that an internal space surrounded in the U shape communicates with an internal atmosphere of the processing container; and a restriction mechanism configured to restrict the cover from retreating by the pressure in the processing container, in which the sealing member is pressurized by the internal atmosphere of the processing container entering into the internal space of the sealing member to be pressed to at least one of the cover or the processing container, thereby airtightly closing a gap between the processing container and the cover.

A surface contacting the internal space of the sealing member may be made of a resin selected from a resin group consisting of polyimide, polyethylene, polypropylene, paraxylene and polyether ether ketone.

Another exemplary embodiment of the present disclosure provides a processing apparatus including: a processing container configured to receive a substrate to be processed which is carried in a processing container through a carrying port and process the substrate using a high-pressure fluid; a cover configured to close the carrying port; a sealing member formed of an elastic body, annularly installed to surround the carrying port when the carrying port is closed by the cover, having a U-shaped longitudinal cross section, and having both ends of a U-shaped part which are curved outward to form curved end portions, and disposed such that an internal space surrounded in the U shape communicates with an internal atmosphere of the processing container; a cover member configured to cover the sealing member from the outside of the U-shaped part when seen from a longitudinal cross section of the sealing member in order to restrict deformation of the sealing member; and a restriction mechanism configured to restrict the cover from retreating by the pressure in the processing container, in which when the carrying port of the processing container is closed by the cover, the curved end portions are brought in contact with the processing container and the cover to airtightly close a gap between the processing container and the cover, and as the pressure in the processing container is increased to widen the gap, the sealing member is pressed and deformed in the cover member by the internal atmosphere of the processing container entering into the internal space and the curved end portions are widened outward to maintain the gap in an airtightly closed state.

The sealing member may be made of a resin selected from a resin group consisting of polyimide, polyethylene, polypropylene, para-xylene and polyether ether ketone.

Yet another exemplary embodiment of the present disclosure provides a processing apparatus including: a processing container configured to receive a substrate to be processed through a carrying port and process the substrate using a high-pressure fluid; a groove portion annularly formed to surround the carrying port; a sealing member installed in the groove portion along the groove portion; a cover closing the carrying port and having a circumferential edge which faces and contacts the sealing member; a communicating path configured to allow internal atmospheres of the groove portion and the processing container to communicate with each other; and a restriction mechanism configured to restrict the cover from retreating by the pressure in the processing container, in which the sealing member is pressurized by the internal atmosphere of the processing container through the communicating path to be pressed to the cover to airtightly close a gap between the groove portion and the cover.

In the processing apparatus, the cover is configured such that a part of the cover enters into the groove portion along the groove portion with the carrying port closed. Further, the groove portion is configured in a tapered shape such that a space in the groove portion is gradually widened in a carrying-in direction of the substrate to be processed from the cover side.

In the processing apparatus, a concave portion is provided in the processing container, and an opening for carrying the substrate to be processed in and out of the processing container is formed on the bottom of the concave portion, and the processing apparatus includes an annular carrying port forming member which is disposed in the concave portion, forms the carrying port continuous with the opening, and has the groove portion formed between an outer circumferential surface thereof and an inner circumferential surface of the concave portion. Further, the carrying port forming member is provided to be movable in a carrying-in direction of the substrate to be processed with respect to the concave portion.

According to the exemplary embodiments of the present disclosure, a processing using the high-pressure fluid is performed onto the substrate to be processed in the processing container while the sealing member is installed to surround the carrying port of the processing container, the circumferential edge of the cover faces and contacts the sealing member to close the carrying port, and the cover is restricted from retreating by the pressure in the processing container by the restriction mechanism. Therefore, since the sealing member is pressurized by the internal atmosphere of the processing container to be pressed to the cover, the gap between the cover and the processing container may be airtightly closed, thereby ensuring airtightness of the processing container. Since the sealing member does not slide with respect to the processing container or the cover, the generation of particles is suppressed.

Hereinafter, a configuration of an exemplary embodiment of a supercritical processing apparatus constituting a processing apparatus of the present disclosure will be described with reference to FIGS. 1 to 7. A supercritical processing apparatus 1 includes a processing chamber 2 in which a supercritical processing of drying a wafer W using a supercritical fluid is performed. Processing chamber 2 corresponds to a processing container of supercritical processing apparatus 1 according to the present exemplary embodiment and is configured as a flat pressure-resistant container having a rectangular parallelepiped shape. Inside processing chamber 2, a flat processing space 20 (see FIG. 3) capable of housing a wafer holder 21 constituting a substrate holding portion for holding wafer W in a horizontal state is formed. Assuming that a wafer W having a diameter of 300 mm is being processed, processing space 20 is configured as a relatively narrow space having, for example, a height of several mm to around a dozen of mm and a volume of about 300 $cm^2$ to 1,500 $cm^2$ so as to allow a supercritical fluid to sufficiently flow between wafer W and an inner wall surface of processing chamber 2 and to fill an atmosphere in processing space 20 with a supercritical fluid in a short time before isopropyl alcohol (IPA) adhered to wafer W is naturally dried.

On a front surface of processing chamber 2, an opening 22, which is elongated in a horizontal direction (X direction of FIG. 1), is formed to carry in wafer W. Above and below opening 22 in processing chamber 2, two flat-plate type protruding portions 23 are installed to protrude in a front and rear direction (Y direction of FIG. 1). On each protruding portion 23, insertion holes 24 are formed to insert a lock plate as described below. Hereinafter, left sides of FIGS. 1 to 3 will be continuously described as a front side of a front and rear direction.

Outside opening 22 of processing chamber 2, an annular carrying port forming member 3 is installed to form a carrying port 31 continuous with opening 22, as shown in FIGS. 3 to 8. Carrying port 31 is configured to carry wafer W to processing space 20 of processing chamber 2. Carrying port forming member 3 is provided to protrude from a side wall portion 25 around opening 22 of processing chamber 2, a front portion 30 thereof is formed in a surface type to connect a cover which will be described below, and an opening formed on carrying port forming member 3 forms a wafer W carrying port 31 of processing chamber 2.

Around carrying port forming member 3, a concave portion forming member 4 for forming a concave portion in processing chamber 2 is provided. Concave portion forming member 4 has a longitudinal cross section formed in, for example, a reverse " " shape and includes a surface portion 42 connecting side wall portion 25 of processing chamber 2 and an annular wall portion 43 which is installed to protrude toward a front side of processing chamber 2 from surface portion 42. Thus, a concave portion is formed in processing chamber 2, and opening 22 and an opening 40 continuous with carrying port 31 are formed on surface portion 42.

Carrying port forming member 3 and concave portion forming member 4 are made of, for example, stainless steel and surface portion 42 of concave portion forming member 4 is fixed to processing chamber 2, for example, by screw-fixing. Carrying port forming member 3 is fixed to concave portion forming member 4 by screw fixing. Thus, as shown in FIG. 8, an annular groove portion 5 is formed between an outer circumferential surface 32 of carrying port forming member 3 and an inner circumferential surface 44 of concave portion forming member 4 to surround carrying port 31.

Figure 7:
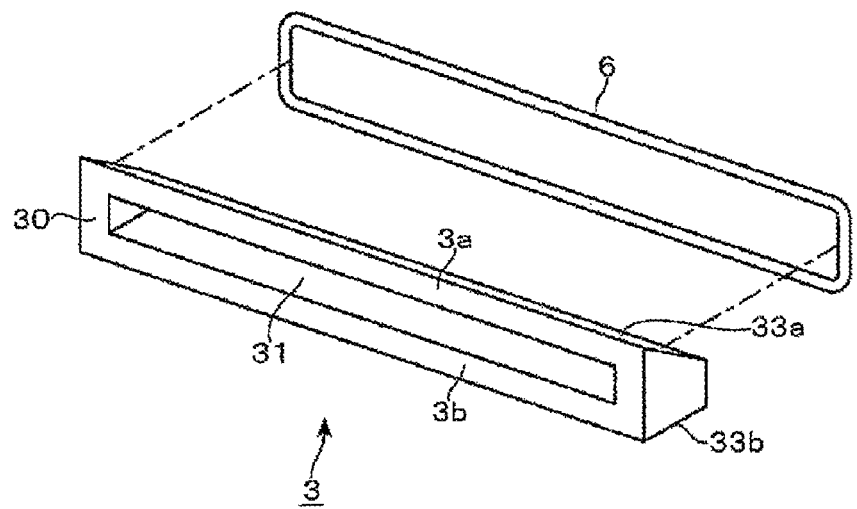
FIG. 7 is an exploded perspective view illustrating a carrying port forming member and a sealing member installed in the processing container.
Figure 8:
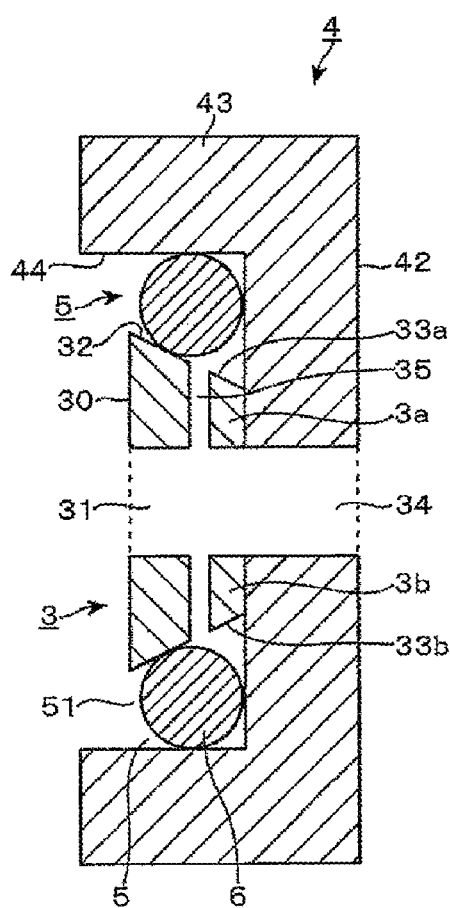
FIG. 8 is a longitudinal cross-sectional side view illustrating the vicinity of the carrying port.

Carrying port forming member 3, as shown in FIGS. 7 and 8, is constituted by tapered surfaces 33a and 33b such that a top surface of a top wall portion 3a gradually faces downward toward processing chamber 2 from carrying port 31, and a bottom surface of a lower wall portion 3b gradually faces downward toward processing chamber 2 from carrying port 31. Therefore, groove portion 5 is configured in a tapered shape such that a vertical space in groove portion 5 becomes gradually larger toward a rear side (processing chamber 2 side) from a front side (opening 51 side of groove portion 5), when seen from one side in a horizontal direction of processing chamber 2.

Figure 3:
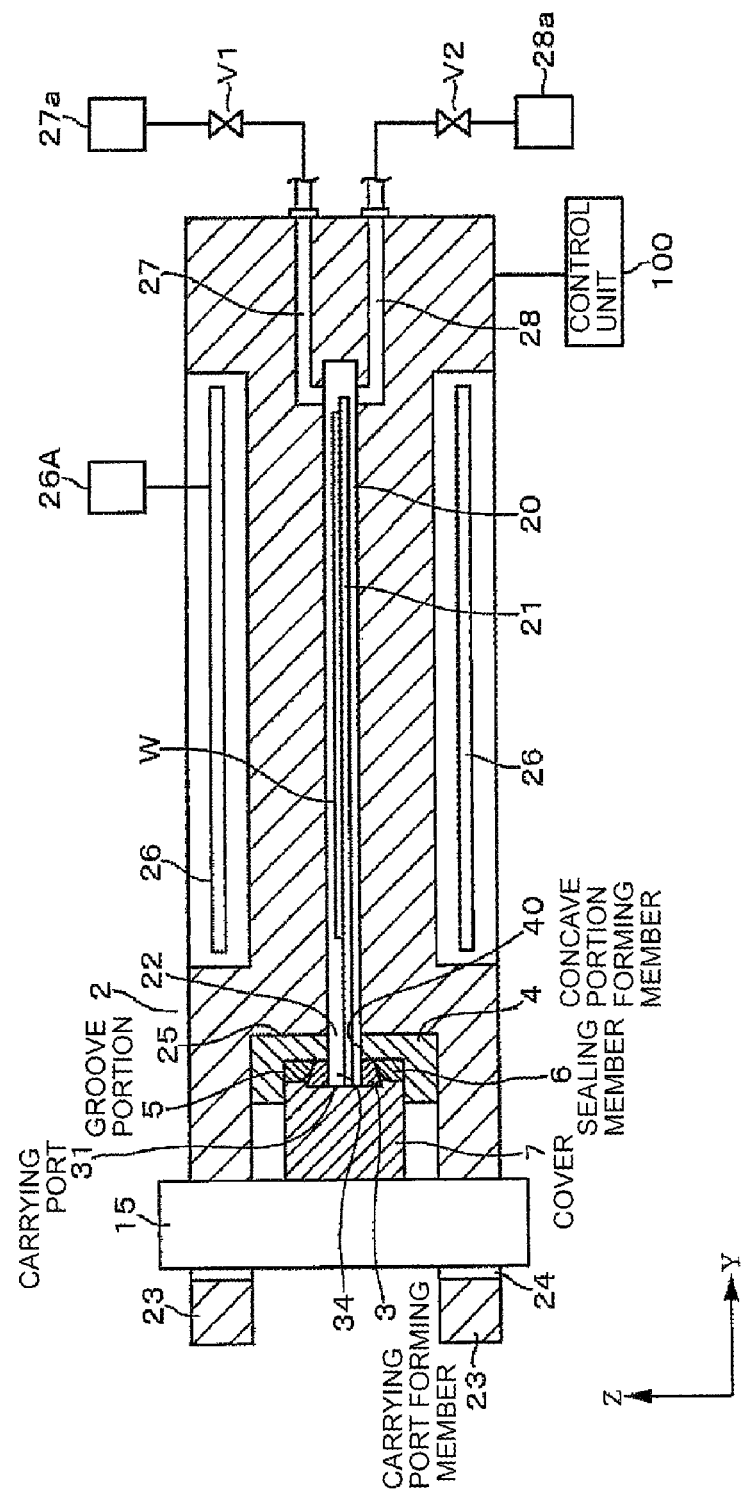
FIG. 3 is a longitudinal cross-sectional side view illustrating a processing container installed in the supercritical processing apparatus.
Figure 5:
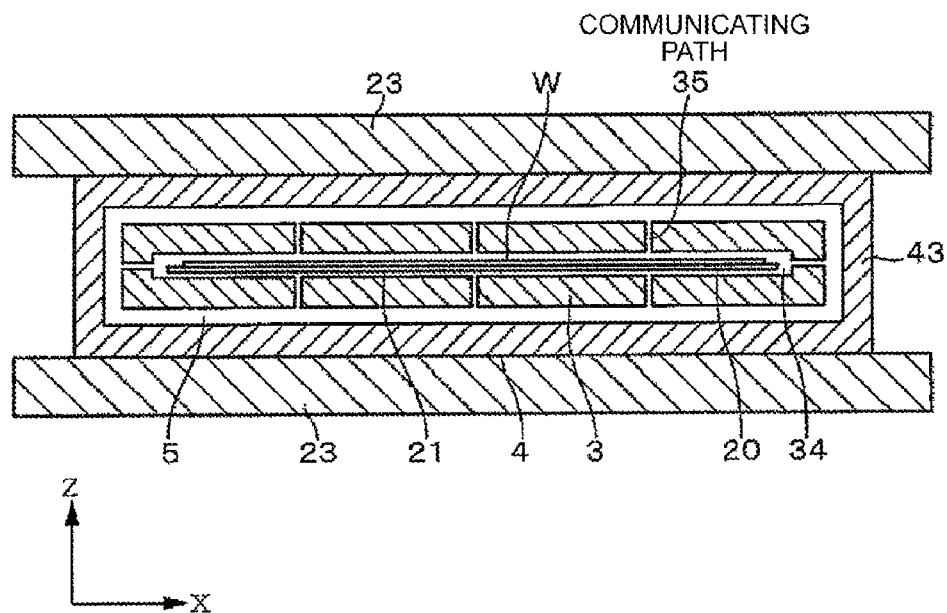
FIG. 5 is a longitudinal cross-sectional view of the processing container.
Figure 6:
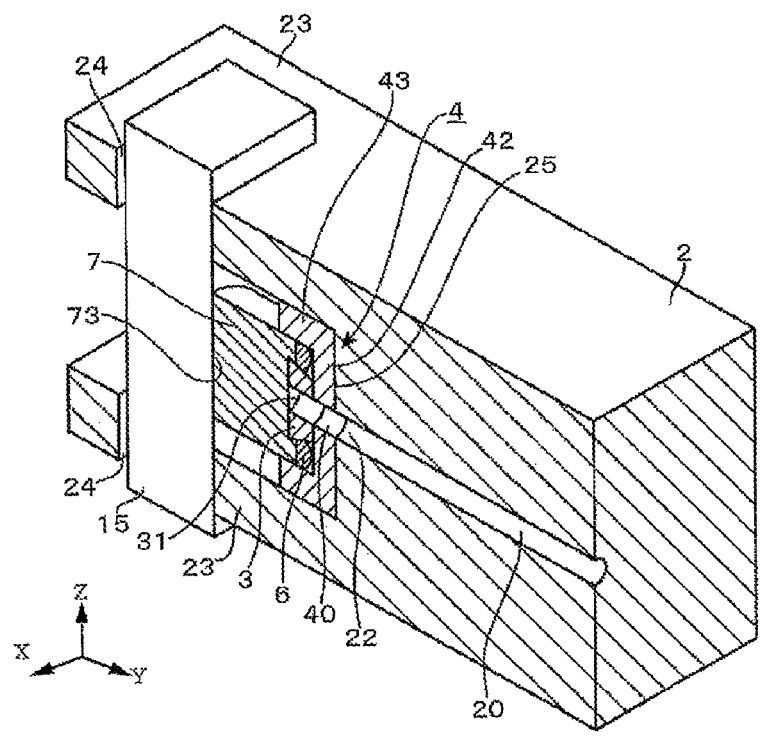
FIG. 6 is a longitudinal perspective view illustrating the vicinity of a carrying port of the processing container.

In carrying port forming member 3, as shown in FIGS. 5 and 8, a plurality of communicating paths 35, of which one ends are opened to a carrying area 34 of carrying port forming member 3 and the other sides are opened to groove portion 5, are formed with intervals along a circumferential direction of carrying port 31. Since carrying area 34 communicates with processing space 20 as shown in FIG. 3, groove portion 5 communicates with an internal atmosphere of processing chamber 2 by communicating paths 35.

In groove portion 5, a sealing member 6 formed of, for example, an annular elastic body, is installed. Sealing member 6 is made of a material that is resistant to a supercritical fluid supplied to processing chamber 2, such as an elastic body, for example, a fluorine resin or rubber, stainless steel, titanium and a special alloy. A shape of a longitudinal cross section of sealing member 6 may be a circle or square, but as shown in FIG. 8, the size of the longitudinal cross section is set to be larger than that of opening 51 of groove portion 5, thereby preventing sealing member 6 from falling from carrying port forming member 3. In order to prevent sealing member 6 from being deteriorated due to a component such as a resin or rubber or impurities contained therein which are eluted in a supercritical fluid, the surface of sealing member 6 may be covered with a polyimide film or coated with $SiO_2$. For the convenience of illustration, in FIG. 5, sealing member 6 is not shown and in FIG. 6, wafer holder 21 and wafer W are not shown.

On both upper and lower surfaces of processing chamber 2, heaters 26 constituted by, for example, a resistant heating element such as a tape heater are installed. Heaters 26 are connected to a power supply unit 26A, and a temperature of a main body and processing space 20 of processing chamber 2 may be maintained within a range of 100° C. to 300° C., for example, 270° C., by increasing and decreasing an output of power supply unit 26A.

In processing chamber 2, a supply path 27 is formed to supply IPA in a supercritical state into processing space 20, and the other end side of supply path 27 is connected to an IPA supplier 27a through a valve V1. In processing chamber 2, a discharge path 28 is formed to discharge the IPA in processing space 20 and discharge path 28 is connected to an IPA recovery portion 28a through a valve V2 that is a pressure adjusting valve for adjusting pressure in processing space 20.

On the upper and lower surfaces of processing chamber 2, an upper plate 11 and a lower plate 12 are installed to insulate an ambient atmosphere from heaters 26 and are cooled by allowing a refrigerant to flow to a cooling tube 10.

On respective front sides of plates 11 and 12, notched portions 11a and 12a are formed at positions corresponding to protruding portion 23.

Figure 2:
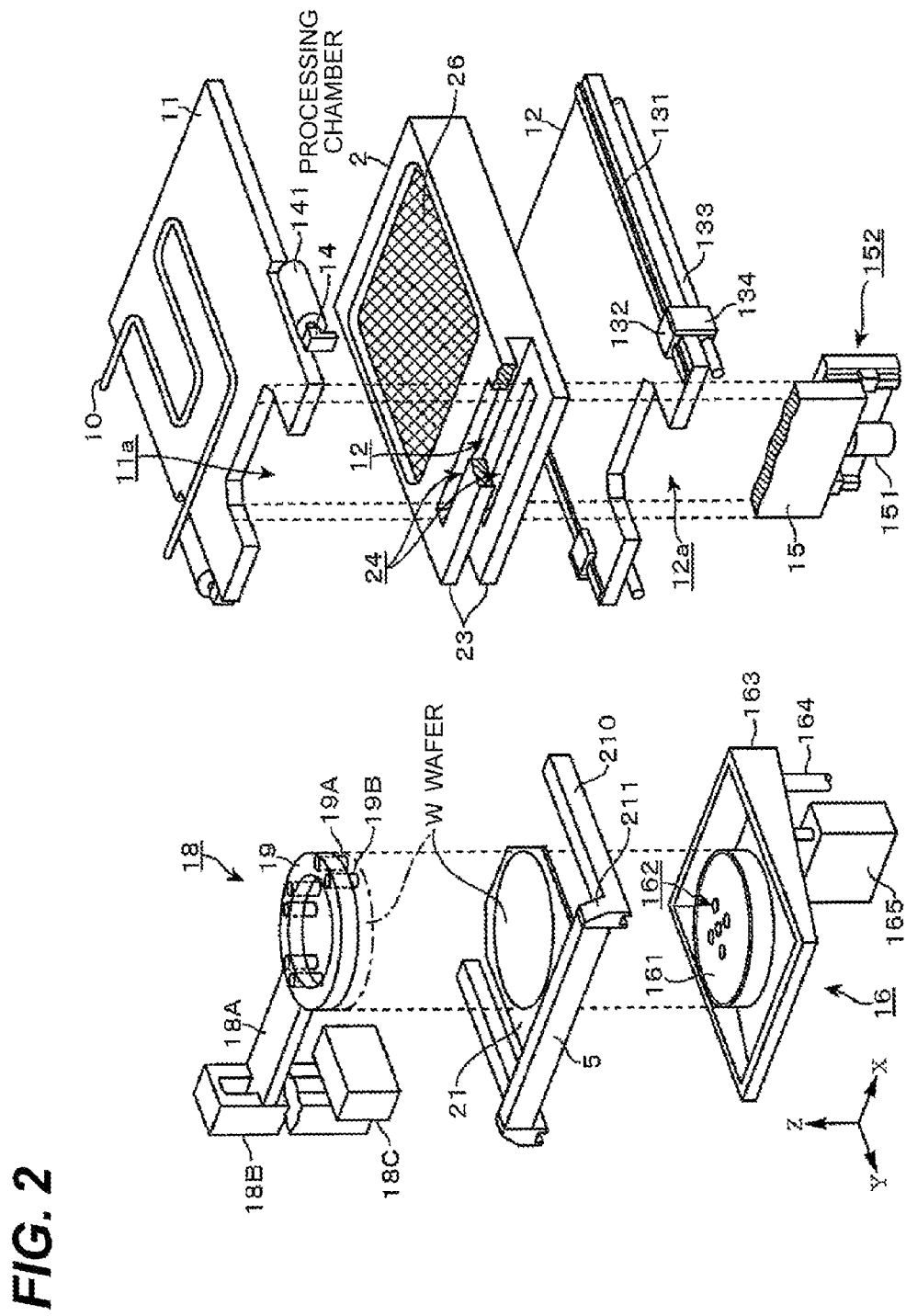
FIG. 2 is an exploded perspective view of the supercritical processing apparatus.

For example, as shown in FIGS. 1 and 2, upper plate 11 and lower plate 12 in the present exemplary embodiment are formed to be wider than processing chamber 2 in a horizontal direction when seen from the front side. On top surfaces of both edges of lower plate 12, a rail 131 is installed to be extended in a front and rear direction. Rail 131 is configured to allow arm members 210 holding wafer holder 21 as described below to travel and reference numeral 132 denotes a slider which travels on rail 131, reference numeral 133 denotes a driving mechanism constituted by, for example, a rod-less cylinder for driving rail 131, and reference numeral 134 denotes a connection member for connecting driving mechanism 133 and slider 132.

Wafer holder 21 is a thin plate type member which is configured to be disposed in processing space 20 of processing chamber 2 in a horizontal state while wafer W is held and is connected to a rectangular column shaped cover 7 extended in a horizontal direction. Cover 7 is inserted between upper and lower protruding portions 23 to close carrying port 31 when wafer holder 21 is carried in processing chamber 2.

Figure 9:
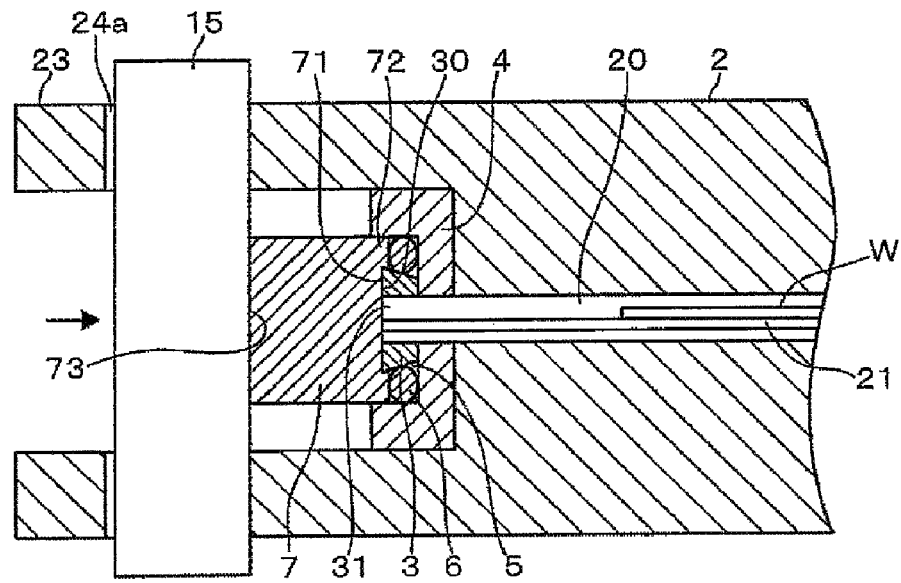
FIG. 9 is a longitudinal cross-sectional side view illustrating the vicinity of the carrying port.
Figure 11:
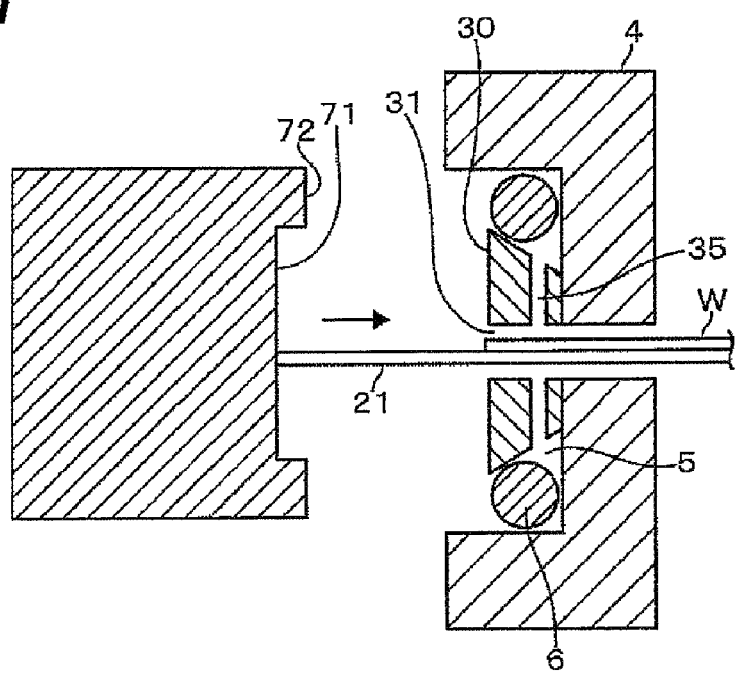
FIG. 11 is a longitudinal cross-sectional side view illustrating the vicinity of the carrying port.
Figure 12:
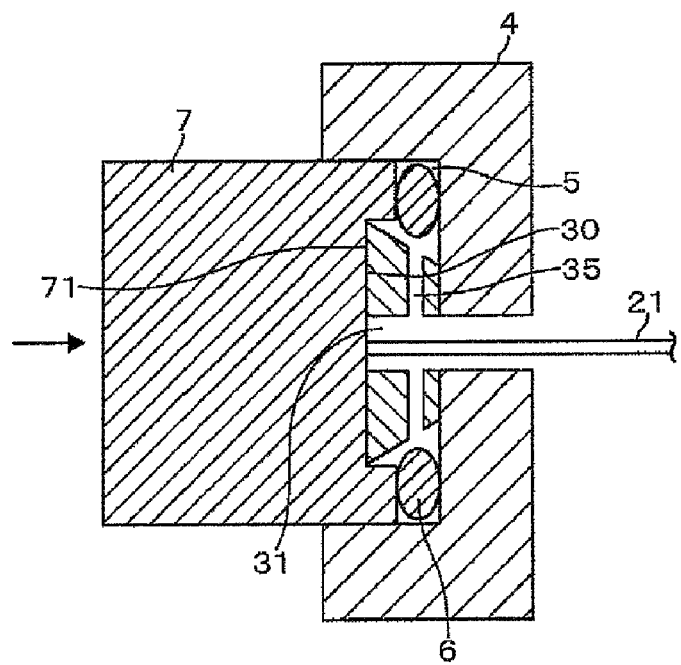
FIG. 12 is a longitudinal cross-sectional side view illustrating the vicinity of the carrying port.

Cover 7 is installed such that a circumferential edge thereof faces and contacts sealing member 6 in groove portion 5 when closing carrying port 31. For example, as shown in FIGS. 9, 11, and 12, cover 7 includes a surface portion 71 which faces carrying port 31 of processing chamber 2 and is larger than carrying port 31 and an annular protruding portion 72 which enters groove portion 5. Surface portion 71 is installed to contact front portion 30 of carrying port forming member 3 and is configured such that protruding portion 72 enters groove portion 5 when surface portion 71 contacts front portion 30. As such, cover 7 exemplified above is configured such that a part of cover 7 (protruding portion 72) enters into groove portion 5 along groove portion 5 with carrying port 31 closed.

Arm members 210 extended in a front and rear direction are installed at both left and right ends of cover 7 and may travel on rail 131 by connecting arm members 210 to slider 132. When slider 132 is moved up to a front end side of rail 131, wafer holder 21 is extracted up to a transfer location outside processing chamber 2 as shown in FIG. 1. At the transfer location, wafer W is transferred between wafer holder 21 and a carrying arm as described below. Meanwhile, when slider 132 is moved up to a rear end side of rail 131, wafer holder 21 moves up to a processing location inside processing chamber 2 (processing space 20) as shown in FIG. 3. At the processing location, supercritical processing is performed onto wafer W.

Protruding portions 211 protruding upward are installed at one front ends of the left and right arm members 210. In the meantime, lock members 14 are installed at a processing chamber 2 side, for example, in front areas of both left and right ends of upper plate 11. Lock member 14 is configured to be rotatable by a lock cylinder 141 and when a protrusion of lock member 14 is unlocked in a horizontal direction, protruding portion 211 is unlocked from a locked state (see FIG. 1), and as shown in FIG. 2, when the protrusion is turned to face downward, protruding portion 211 is locked in lock member 14.

In front of processing chamber 2, a lock plate 15 is installed. Lock plate 15 functions to restrict movement of cover 7 when wafer holder 21 is moved up to the processing location. One end and the other end of lock plate 15 are inserted into insertion holes 24, such that movement of lock plate 15 in a front and rear direction (Y direction of FIG. 3) is restricted. Lock plate 15 is configured to move vertically by an elevating mechanism 151 between a locking location where lock plate 15 are inserted into insertion holes 24 to press cover 7 and an opening location where lock plate 15 retreats downward from the locking location to open cover 7. Reference numeral 152 as shown in FIG. 2 denotes a slide mechanism that allows lock plate 15 to travel on the rail and guides a movement direction of lock plate 15. In the example, a restriction mechanism is configured to restrict cover 7 from retreating by the pressure in processing chamber 2 by lock plate 15, insertion holes 24 and elevating mechanism 15. Since a margin required for inserting and detaching lock plate 15 is provided in insertion hole 24, a narrow gap 24a is formed between insertion hole 24 and lock plate 15 disposed at the locking location. For convenience of illustration, gap 24a is exaggerated in the figure.

As shown in FIG. 2, below wafer holder 21 moved up to the transfer location, a cooling mechanism 16 for cooling wafer holder 21 is installed. Cooling mechanism 16 includes a cooling plate 161 and a discharge hole 162 discharging, for example, a clean air for cooling. Reference numeral 163 of FIG. 2 denotes a drain tray 163 that receives IPA flowing from wafer W and discharges the IPA to a drain tube 164. Reference numeral 165 of FIG. 2 denotes an elevating mechanism that rises to perform cooling of wafer holder 21 when wafer holder 21 moves up to the transfer location.

Reference numeral 17 as shown in FIG. 1 denotes an IPA nozzle for supplying IPA to wafer W transferred to wafer holder 21. The IPA nozzle supplies the IPA to wafer W again before wafer W is carried in processing chamber 2 such that while a sufficient amount of IPA is adhered to wafer W so as not to naturally dry wafer W, corresponding wafer W is carried in processing chamber 2.

The supercritical processing apparatus having the aforementioned configuration is connected to a control unit 100 which is constituted by, for example, a computer including a CPU and a memory (not shown). The memory has a program recorded therein, in which the program includes an operation of supercritical processing apparatus 1, that is, a group of steps for performing supercritical processing of wafer W. The program is stored in a recording medium such as a hard disc, a compact disc, a magneto-optical disc, and a memory card, and is installed from the recording medium in the computer.

Next, the operation of the present disclosure will be described. Wafer W completed with a cleaning process in a single-wafer type cleaning apparatus (not shown) is carried into supercritical processing apparatus 1. In the cleaning apparatus, for example, removal of particles or organic contaminants by an SC1 liquid (a mixed liquid of ammonia and hydrogen peroxide) which is an alkaline chemical liquid, rinsing using deionized water (DIW) which is a rinse liquid, and removal of a native oxide layer by a hydrofluoric acid aqueous solution (hereinafter, diluted hydrofluoric acid (DHF)) which is an acid chemical liquid, and rinsing using the DIW, are performed in this order, and finally IPA is adhered to the wafer surface. Wafer W is carried out from the cleaning apparatus in this state and carried in to supercritical processing apparatus 1.

The carrying of wafer W to supercritical processing apparatus 1 is performed using, for example, a carrying arm 18. Carrying arm 18, as shown in FIG. 2, includes a holding ring 19 for holding wafer W at a front end of an arm member 18A extended in a horizontal direction, and is capable of moving up and down by an elevating mechanism 18B and forward and backward by a moving mechanism 18C. In holding ring 19, two pairs of picks 19A, 19B are installed to adsorb and hold, for example, three locations of a circumferential edge of a top surface of wafer W. And a carrying-in pick 19A for holding wafer W before performing supercritical processing at the time of carrying-in and a carrying-out pick 19B for holding wafer W after performing supercritical processing at the time of carrying-out are separately used.

When a wafer is carried in to processing chamber 2, carrying arm 18 transfers corresponding wafer W to wafer holder 21 which stands by at a transfer location and then retreats from an upper location of wafer holder 21. As shown in FIG. 1, with cooling plate 161 disposed at a cooling location, IPA is supplied to the surface of wafer W from IPA nozzle 17 to perform an adhesion of IPA again.

Meanwhile, processing chamber 2 is in a heated state, for example, at 270° C. by heater 26 by turning ON power supply unit 26A. An ambient temperature of processing chamber 2 is not excessively increased by cooling tube 10 to prevent the IPA supplied to the surface of wafer W on wafer holder 21 from evaporating. In this case, valves V1, V2 of supply path 27 and discharge path 28 are closed and processing chamber 2 is under atmospheric pressure.

Figure 4:
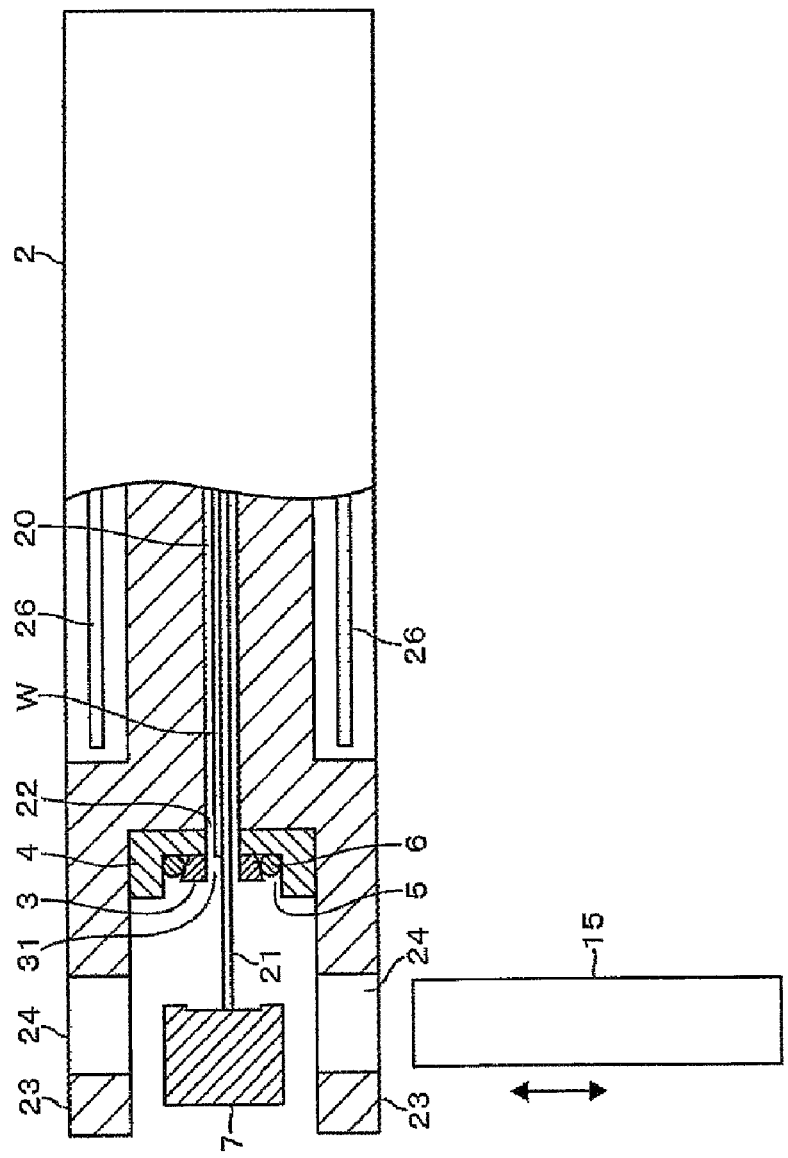
FIG. 4 is a longitudinal cross-sectional side view illustrating a processing container installed in the supercritical processing apparatus.

Subsequently, arm member 210 is slid on rail 131 to move wafer holder 21 up to the processing location as shown in FIGS. 4 and 11 and rotate lock member 14, thereby locking protruding portion 211. When carrying port 31 of processing chamber 2 is closed by cover 7, lock plate 15 is raised up to the locking location, and as shown in FIG. 9, lock plate 15 is brought into contact with front surface 73 of cover 7 to restrict movement of cover 7. In this state, as shown in FIGS. 3, 9, and 12, protruding portion 72 of cover 7 enters into groove portion 5, and in this example, sealing member 6 is squashed between protruding portion 72 and groove portion 5, thereby airtightly closing carrying port 31.

Figure 10:
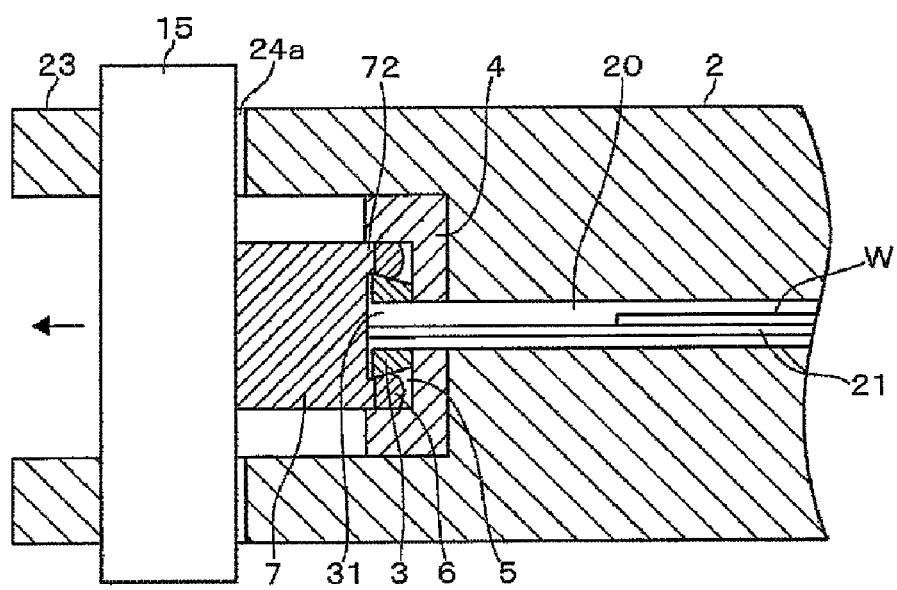
FIG. 10 is a longitudinal perspective view illustrating the vicinity of the carrying port.
Figure 13:
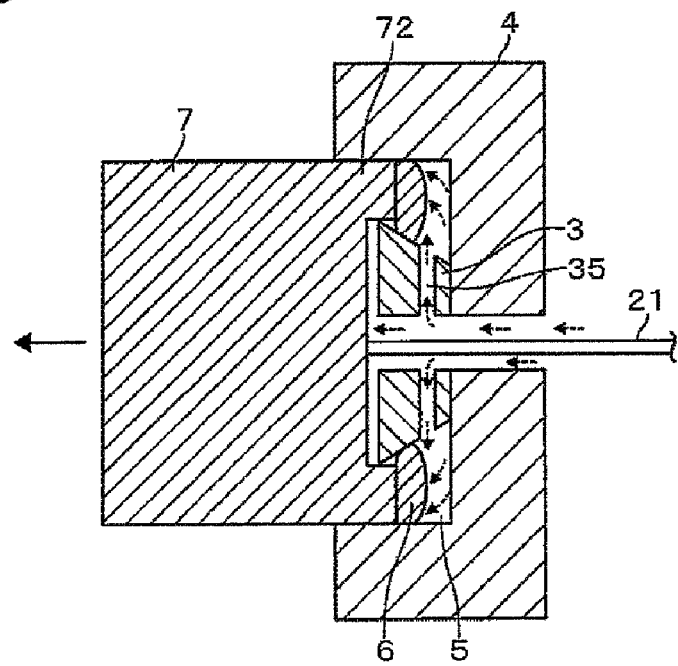
FIG. 13 is a longitudinal cross-sectional side view illustrating the vicinity of the carrying port.

Before the IPA adhered to the surface of wafer W is dried, a supercritical IPA is supplied to processing space 20 through supply path 27 by opening valve V1, and the pressure in processing space 20 is boosted up to, for example, 10 MPa. In this case, since an atmosphere in processing space 20 communicates with groove portion 5 by communicating path 35, as shown in FIGS. 10 and 13, as processing space 20 is pressurized, the atmosphere in processing space 20 flows into groove portion 5 through communicating path 35 to pressurize the inside of groove portion 5. By the pressure in groove portion 5, cover 7 presses lock plate 15 through sealing member 6. Thus, when the pressure in groove portion 5 (the pressure in processing chamber 2) is increased, since narrow gap 24a is formed in insertion hole 24 as described above, cover 7 and lock plate 15 retreat by gap 24a.

Since an additional movement of cover 7 is restricted by lock plate 15, the pressure in groove portion 5 is further increased. Therefore, sealing member 6 is pressed to protruding portion 72 of cover 7 by the pressure in groove portion 5, but as pressurizing force in groove portion 5 is increased, the pressing force of sealing member 6 is increased, and thus, a sealing function is improved. As a result, as shown in FIG. 13, a space between cover 7 and groove portion 5 is airtightly closed by sealing member 6.

In the meantime, in processing space 20, when the supercritical IPA supplied into corresponding processing space 20 contacts the IPA adhered to wafer W, the adhered IPA receives heat from the supercritical IPA and evaporates to be in a supercritical state. Consequently, the liquid IPA on the surface of wafer W is substituted by the supercritical IPA. However, since an interface is not formed between the liquid IPA and the supercritical IPA in an equilibrium state, the fluid of the surface of wafer W can be substituted with the supercritical IPA without causing a pattern collapse.

When the surface of wafer W is in a substituted state with the supercritical IPA after the supercritical IPA is supplied into processing space 20 and a predetermined time passes, valve V2 is opened to discharge the atmosphere in processing space 20 toward IPA recovery portion 28a. As a result, since the pressure in the processing chamber is gradually decreased while the temperature in processing space 20 is maintained at a higher temperature than a boiling point of IPA (82.4° C.) at normal pressure, the IPA in processing space 20 is changed from the supercritical state to a gaseous state. In this case, since no interface is formed between the supercritical state and a gas, the wafer W may be dried without applying the surface tension to the pattern formed on the surface.

As the pressure in processing chamber 2 is decreased, the pressure in groove portion 5 is reduced, and thus, the sealing member 6 is guided by tapered surfaces 33a, 33b of carrying port forming member 3 to return to an original position (position as shown in FIG. 12), and lock plate 15 and cover 7 move forward up to original positions. Therefore, after the pressure in processing chamber 2 is decreased, sealing member 6 is squashed between protruding portion 72 and groove portion 5, thereby maintaining airtightness of processing chamber 2.

By the aforementioned process, after the supercritical processing of wafer W is completed, in order to discharge the gaseous IPA remaining in processing space 20, an $N_2$ gas is supplied from a purge gas supply line (not shown) to perform purging toward an exhaust path 28. After the $N_2$ gas is supplied for a predetermined time to complete the purging and the inside of processing chamber 2 returns to atmospheric pressure, lock plate 15 is lowered up to the unlocking location to unlock the locked state of protruding portion 211 by lock member 14. Wafer holder 21 is moved to the transfer location to carry supercritical processing-finished wafer W while wafer W is adsorbed and maintained by carrying-out pick 19B of carrying arm 18.

According to the aforementioned exemplary embodiment, sealing member 6 is installed in groove portion 5 which is installed to surround carrying port 31 of processing chamber 2, and the circumferential edge of cover 31 faces and contacts sealing member 6 to close carrying port 31. While lock plate 15 restricts cover 7 from retreating by the pressure in processing chamber 2, a drying process using the supercritical fluid is performed on wafer W in processing chamber 2. Accordingly, since sealing member 6 is pressurized by the internal atmosphere of processing chamber 2 through communicating path 25 to be pressed toward cover 7, the gap between groove portion 5 and cover 7 may be airtightly closed, thereby ensuring airtightness of processing chamber 2.

That is, in the configuration in which the movement of cover 7 is restricted by lock plate 15, when the pressure in processing chamber 2 becomes high as described above, lock plate 15 and cover 7 retreat by the margin of insertion hole 24. However, protruding portion 72 enters into groove portion 5 and protruding portion 72 retreats in groove portion 5, and as a result, sealing member 6 is pressed to protruding portion 72 (cover 7) by pressurization in groove portion 5, thereby ensuring airtightness between groove portion 5 and cover 7.

As described above, in groove portion 5 with sealing member 6, the position of protruding portion 72 of processing chamber 2 is only changed but no gap is newly formed between cover 7 and processing chamber 2. The force of pressing sealing member 6 to cover 7 is weaken by the reduced pressure in processing chamber 2, and thus, sealing member 6 returns to the original position. Therefore, since sealing member 6 is never caught in the gap between cover 7 and processing chamber 2 and never damaged, the airtightness of processing chamber 2 is ensured even when the pressure in processing chamber 2 is changed. Since sealing member 6 slightly moves inside groove portion 5, but at this time, sealing member 6 does not slide in groove portion 5, there is no concern about the generation of particles due to deterioration in sealing member 6.

Figure 14:
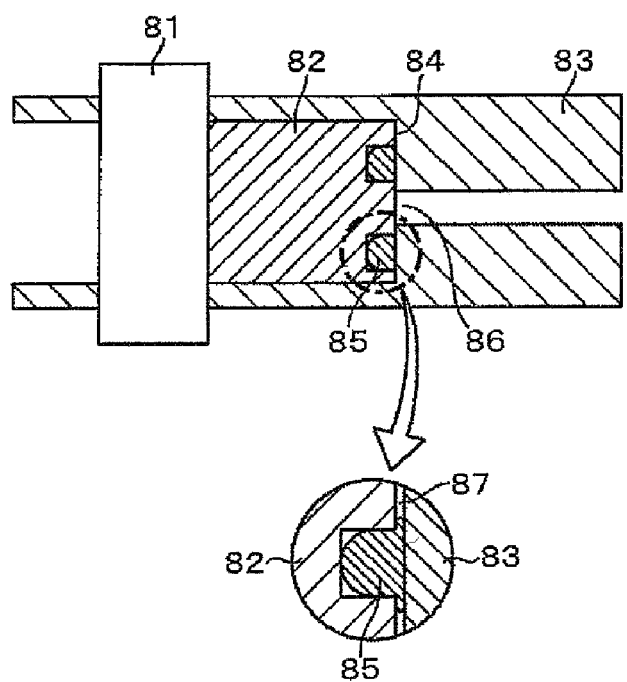
FIG. 14 is a longitudinal cross-sectional side view illustrating the vicinity of a carrying port of a processing container in the related art.

Herein, as described above, in the configuration in which a lock plate 81 restricts a cover 82 from retreating by the pressure in a processing chamber 83, as shown in FIG. 14, a configuration is considered in which a sealing member 85 is installed on a surface portion 84 in an advance and retreat direction of cover 82 between cover 82 and processing chamber 83 to airtightly close a carrying port 83. When the internal pressure of processing chamber 83 is increased and lock plate 81 and cover 82 retreat, a gap 87 is formed between cover 82 and processing chamber 83. When the pressure in processing chamber 83 is reduced after a drying process is performed in this state, sealing member 85 is caught in gap 87. Since cover 82 tends to return to the original position, a large force is applied to sealing member 85 in corresponding gap 87, and thus, corresponding sealing member 85 is damaged, which makes it difficult to maintain airtightness of the processing chamber.

Figure 15:
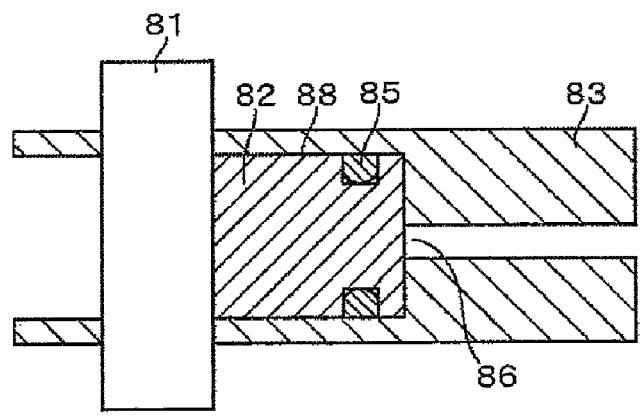
FIG. 15 is a longitudinal cross-sectional side view illustrating the vicinity of a carrying port of a processing container in the related art.

As shown in FIG. 15, in the configuration in which sealing member 85 is installed on a surface portion 884 at a lateral side with respect to the advanced and retreat direction between cover 82 and processing chamber 83, no gap is formed between cover 82 and processing chamber 83 even when the pressure of processing chamber 83 is high, thereby preventing sealing member 85 from being caught. However, when moving cover 82 forward and backward, sealing member 85 slides with respect to the side of processing chamber 83, which sealing member 85 to deteriorate, and thus, particles are easily generated.

In the aforementioned configuration, since an outer surface of carrying port forming member 3 is configured as tapered surfaces 33a, 33b such that groove portion 5 becomes gradually larger toward processing chamber 2, sealing member 6 may be prevented from falling, as described above. When sealing member 6 moves in groove portion 5, tapered surfaces 33a, 33b serve as guide surfaces to assist the movement of sealing member 6, and as a result, a rapid movement of sealing member 6 is attained.

Subsequently, another exemplary embodiment of the processing apparatus of the present disclosure will be described with reference to FIGS. 16 to 20. The exemplary embodiment is different from the aforementioned exemplary embodiment in that a carrying port forming member 3A is installed on a concave portion forming member 4A to be movable in an advance and retreat direction of a cover 7A.

Figure 17:
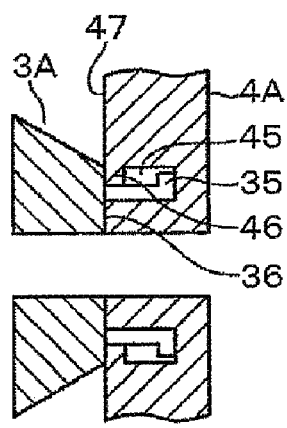
FIG. 17 is a longitudinal cross-sectional side view illustrating a carrying port forming member of FIG. 16.

In this case, carrying port forming member 3A is installed on concave portion forming member 4A through a suspending member 35. Suspending member 35, as shown in FIG. 17, is configured to be movable in the advance and retreat direction in a movement area 45 formed inside concave portion forming member 4A, and a fixing portion 46 on which suspending member 35 is suspended is installed at a front end of movement area 45. In this example, cover 7A does not include a protruding portion. The other elements are configured to be the same as those of the aforementioned exemplary embodiment.

Figure 16:
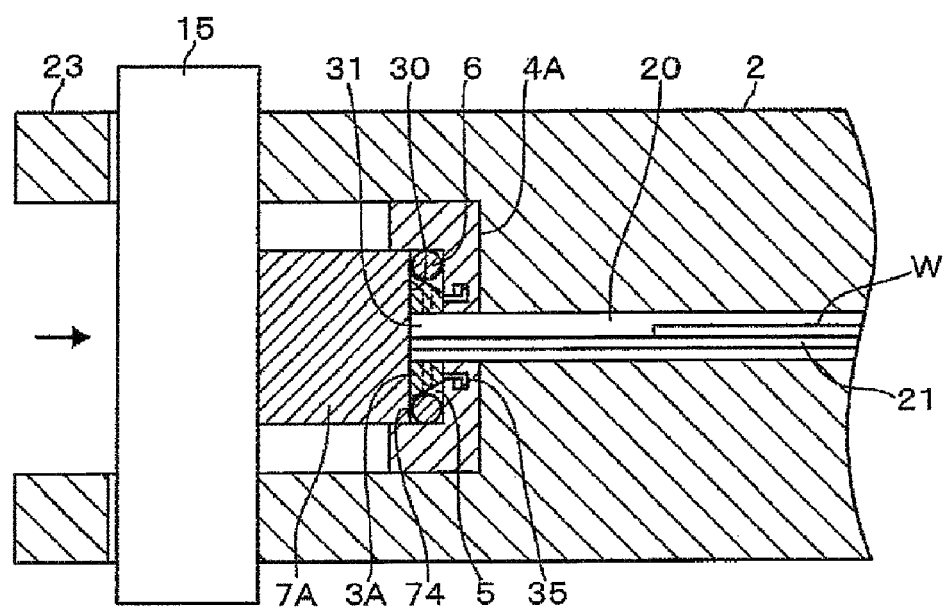
FIG. 16 is a longitudinal cross-sectional side view illustrating the vicinity of a carrying port of a processing container installed in another example of the supercritical processing apparatus.
Figure 18:
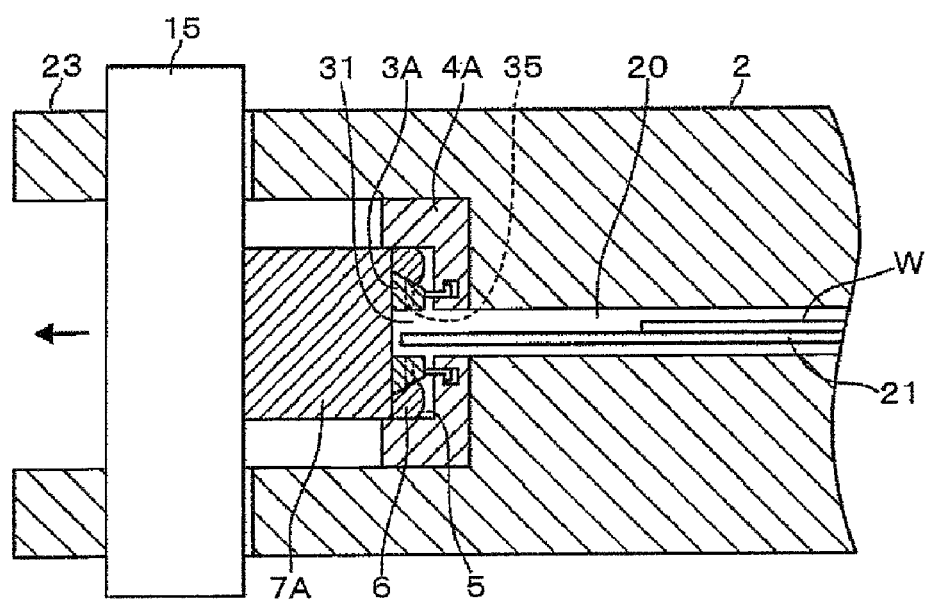
FIG. 18 is a longitudinal cross-sectional side view illustrating the vicinity of the carrying port of the processing container of FIG. 16.
Figure 19:
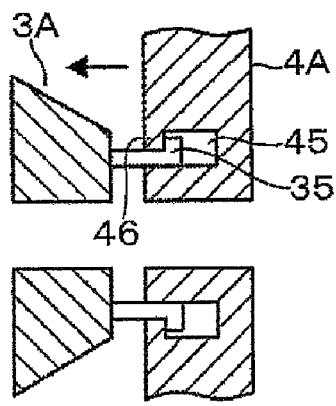
FIG. 19 is a longitudinal cross-sectional side view illustrating the carrying port forming member of FIG. 16.

In this example, as shown in FIG. 16, when the pressure from processing chamber 2 is not applied to cover 7A, suspending member 35 is disposed at a rear end of movement area 45, and a rear surface 36 of carrying port forming member 3A contacts a front surface 47 of concave portion forming member 4. In this case, a circumferential edge of cover 7A enters into concave portion forming member 4A, such that a surface portion 74 contacts a front surface 30 of carrying port forming member 3A to close carrying port 31. Meanwhile, when the pressure in processing chamber 2 is increased during processing wafer W, the inside of groove portion 5 is pressurized through communicating path 35, and thus, as shown in FIG. 18, cover 7A retreats together with lock plate 15 by the internal pressure of processing chamber 2. In this case, by the retreat of cover 7A, as shown in FIG. 19, carrying port forming member 3A also moves toward cover 7A due to the pressure from processing chamber 2, and thus, suspending member 35 is suspended on fixing portion 46 of a rear side of movement area 45.

Even in the configuration, sealing member 6 is pressed toward cover 7A in groove portion 5 by pressurization in groove portion 5 to airtightly close a space between cover 7A and groove portion 5. In this case, since no gap is newly formed between cover 7A and groove portion 5, there is no concern that sealing member 6 is caught. Since sealing member 6 does not slide, the generation of particles is also suppressed.

Figure 20:
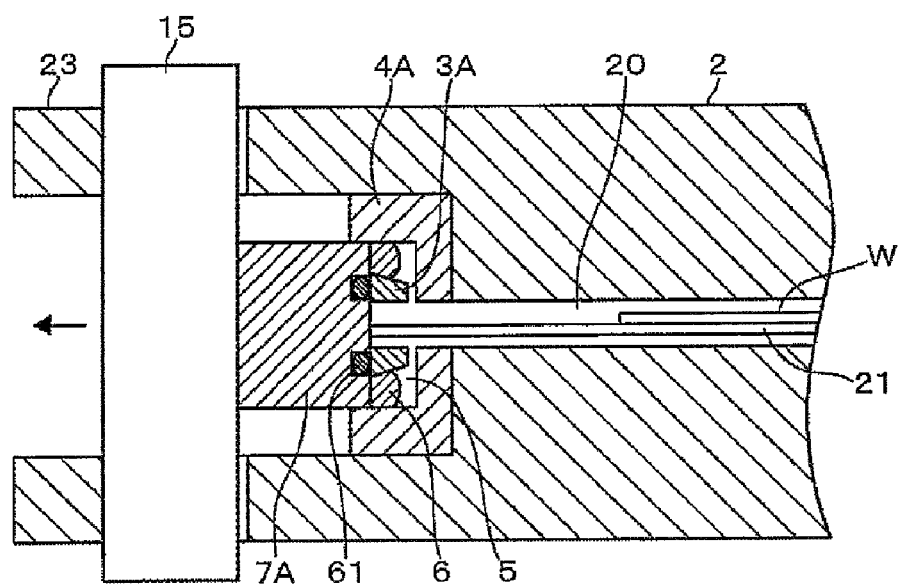
FIG. 20 is a longitudinal cross-sectional side view illustrating the vicinity of a carrying port of a processing container installed in another example of the supercritical processing apparatus.

Herein, as shown in FIG. 20, a new sealing member 61 may be installed on a contact surface between cover 7A and carrying port forming member 3A. FIG. 20 shows a configuration in which carrying port forming member 3A is installed to be movable with respect to concave portion forming member 4A and illustrates a state in which carrying port forming member 3A retreats together with cover 7A due to the pressure in processing chamber 2, but suspending member 35 is not shown.

Figure 21:
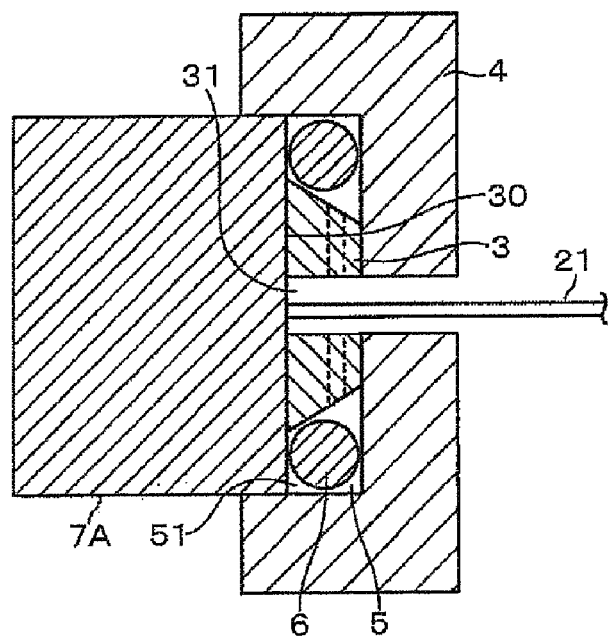
FIG. 21 is a longitudinal cross-sectional side view illustrating the vicinity of a carrying port of a processing container installed in another example of the supercritical processing apparatus.
Figure 22:
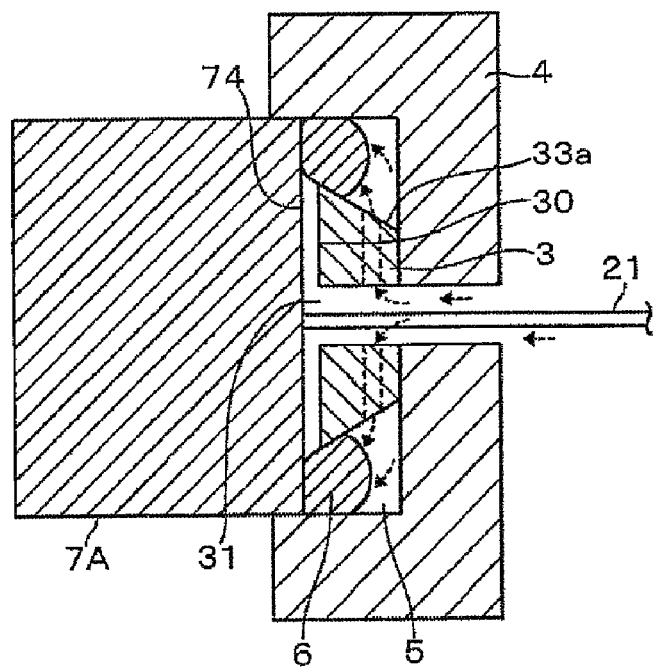
FIG. 22 is a longitudinal cross-sectional side view illustrating the vicinity of the carrying port of the processing container as shown in FIG. 21.

In the configuration, the cover and the concave portion forming member of the present disclosure may be configured as shown in FIGS. 21 and 22. In this example, a carrying port forming member 3 is fixed in concave portion forming member 4 and a protruding portion is not installed on cover 7A. In FIGS. 21 and 22, lock plate 15 is not shown. In this example, when wafer W is carried in, as shown in FIG. 21, cover 7A is configured such that a circumferential edge of cover 7A enters concave portion forming member 4 with carrying port 31 closed, and thus, opening 51 of groove portion 5 may be closed by surface portion 74 of cover 7A.

Meanwhile, when the internal pressure of processing chamber 2 is increased during processing wafer W, as shown in FIG. 22, cover 7A retreats together with lock plate 15 due to the pressure of processing chamber 2, and thus, a gap is formed between surface portion 74 of corresponding cover 7A and a front portion 30 of carrying port forming member 3. However, since cover 7A enters into concave portion forming member 4 to close opening 51 of groove portion 5 such that sealing member 6 is pressed in a contact area between cover 7A and concave portion forming member 4, a space between groove portion 5 and cover 7A may be airtightly closed.

When the pressure of processing chamber 2 is decreased, the pressure of groove portion 5 is reduced, and thus, the pressing force of sealing member 6 toward cover 7A becomes weak and sealing member 6 returns to an original position (position of FIG. 21) along tapered surfaces 33a, 33b of groove portion 5. Cover 7A moves forward to an original position together with lock plate 15, and thus, the gap between surface portion 74 of cover 7A and front portion 30 of carrying port forming member 3 becomes gradually smaller. Therefore, even though the gap is formed between cover 7A and processing chamber 2, sealing member 6 is prevented from being caught in the corresponding gap.

Figure 23:
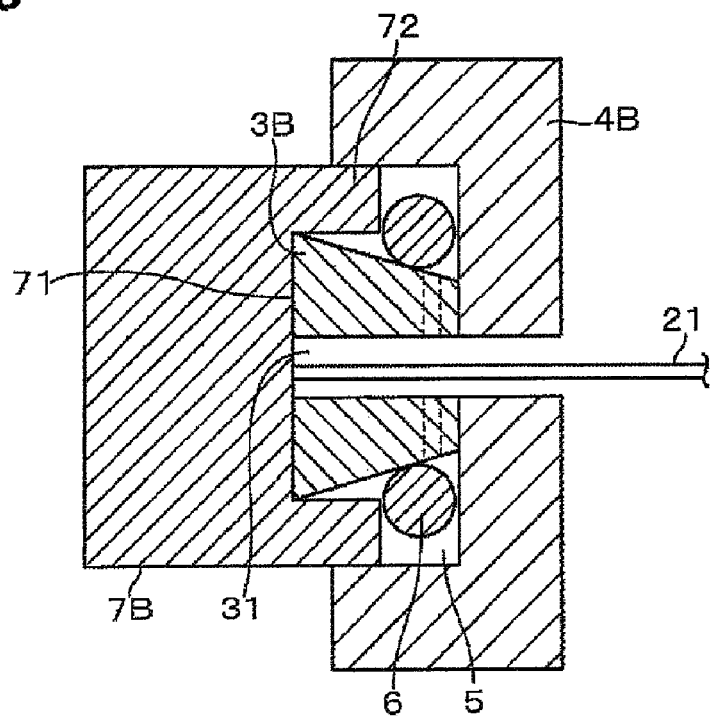
FIG. 23 is a longitudinal cross-sectional side view illustrating the vicinity of a carrying port of a processing container installed in another example of the supercritical processing apparatus.
Figure 24:
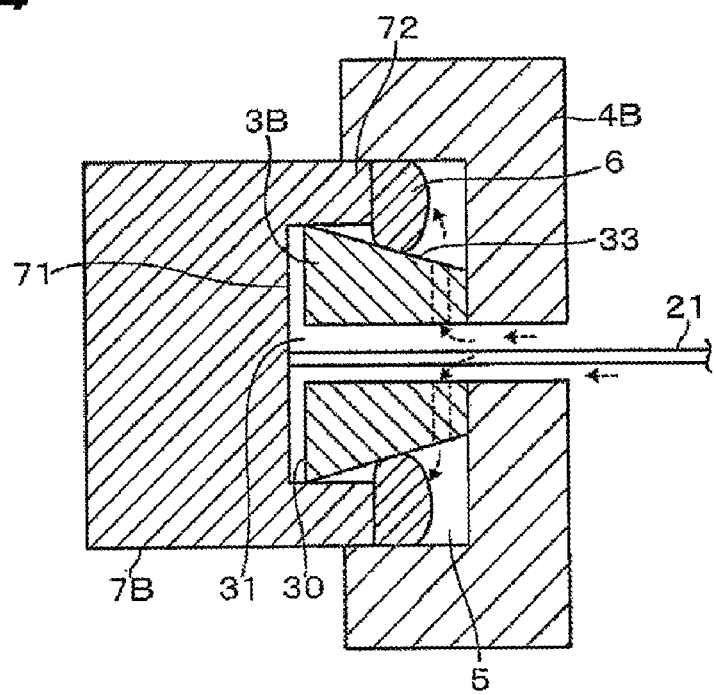
FIG. 24 is a longitudinal cross-sectional side view illustrating the vicinity of the carrying port of the processing container as shown in FIG. 23.

As shown in FIGS. 23 and 24, a carrying port forming member 3B may be configured to protrude toward a cover 7B instead of a front surface of a concave portion forming member 4B. In FIGS. 23 and 24, lock plate 15 is not shown. FIG. 23 illustrates a state in which a protruding portion 72 installed on a circumferential edge of cover 7B enters into a groove portion 5 along groove portion 5 while wafer W is carried in. In this state, a surface portion 71 of cover 7B closes a carrying port 31, and thus, protruding portion 72 enters into groove portion 5, thereby closing carrying port 31.

When the internal pressure of processing chamber 2 is increased during processing wafer W, as shown in FIG. 24, a gap is formed between surface portion 71 of cover 7B and a front portion 30 of a carrying port forming member 3 by the retreat of cover 7B. However, protruding portion 72 enters into groove portion 5 and sealing member 6 is pressed toward cover 7B (protruding portion 72) by pressurization in groove portion 5. Therefore, a space between cover 7B and groove portion 5 is airtightly closed, and as a result, airtightness of processing chamber 2 may be maintained.

Even in this example, when the pressure of processing chamber 2 is decreased, sealing member 6 returns to the original position, and cover 7B also moves to the original position, and as a result, sealing member 6 is prevented from being caught in the gap between cover 7B and processing chamber 2.

Figure 25:
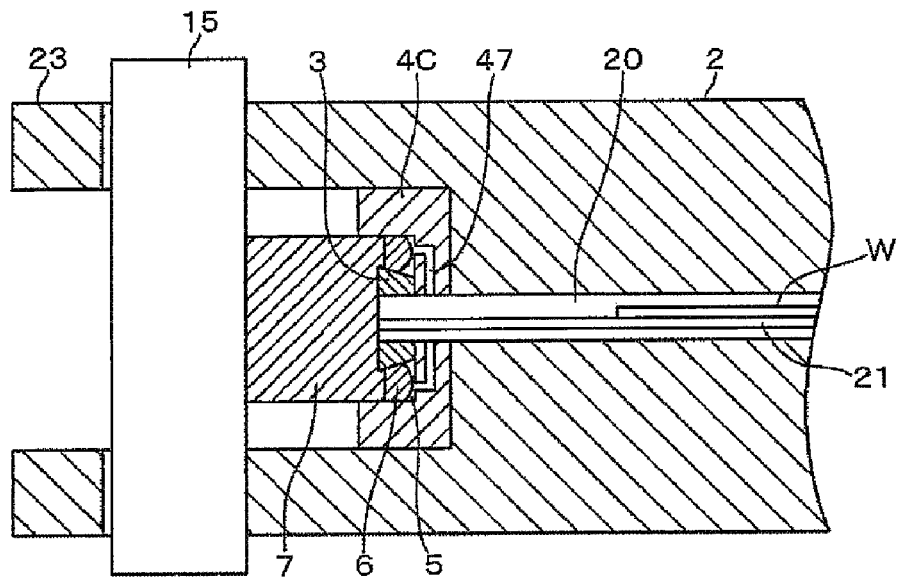
FIG. 25 is a longitudinal cross-sectional side view illustrating the vicinity of a carrying port of a processing container installed in another example of the supercritical processing apparatus.

As shown in FIG. 25, a communicating path 47, which allows internal atmospheres of groove portion 5 and processing chamber 2 to communicate with each other, may be formed at a concave portion forming member 4C side, and may be provided at both a carrying port forming member side and a concave portion forming member side.

Figure 26:
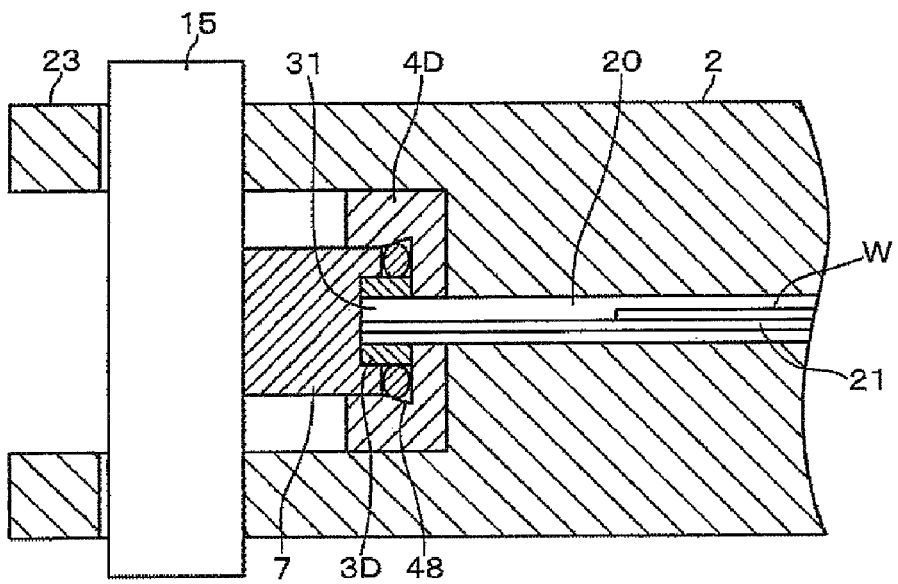
FIG. 26 is a longitudinal cross-sectional side view illustrating the vicinity of a carrying port of a processing container installed in another example of the supercritical processing apparatus.

A tapered portion formed on groove portion 5 may be formed on any one of inner surfaces of the carrying port forming member and the concave portion forming member. For example, as shown in FIG. 26, no tapered surface may be formed on an outer surface of a carrying port forming member 3D but a tapered surface 48 may be formed on an inner surface of a concave portion forming member 4D. In this example, a vertical space in groove portion 5 is configured in a tapered shape such that the vertical space becomes gradually wider in a carrying-in direction of wafer W, but a horizontal space in groove portion 5 may be configured in a tapered shape such that the horizontal space becomes gradually wider in the carrying-in direction of wafer W.

A mechanism of restricting cover 7 is not limited to the configuration using the lock plate as long as the mechanism is configured to restrict cover 7 from retreating by the pressure in processing chamber 2. For example, cover 7 may be restricted using a driving mechanism such as a lock cylinder moving cover 7 between a transfer location and a processing location in processing chamber 2. In a restriction mechanism using lock plate 15, cover 7 retreats slightly due to the pressure in processing chamber 2, but depending on restriction mechanisms, the cover may be restricted to hardly retreat even though the pressure in processing chamber 2 is applied to the cover.

Figure 27:
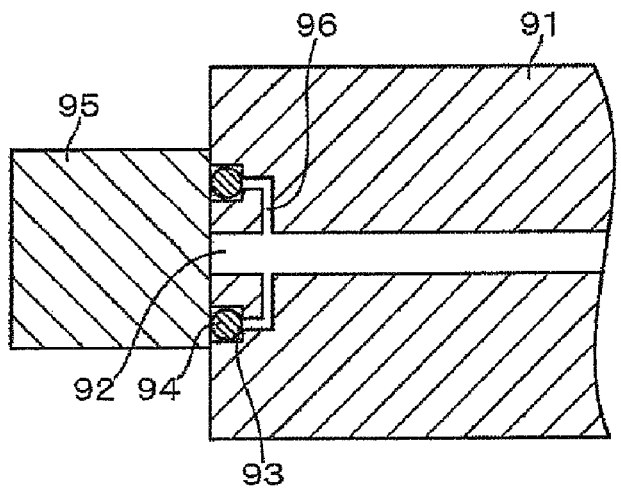
FIG. 27 is a longitudinal cross-sectional side view illustrating the vicinity of a carrying port of a processing container installed in another example of the supercritical processing apparatus.

Processing chamber 2 and concave portion forming member 4 may be integrally formed and a concave portion may be formed on the side of processing chamber 2. As shown in FIG. 27, a carrying port 92 may be formed in a processing chamber 91, an annular groove portion 93 may be formed to surround carrying port 92, and an annular sealing member 94 may be installed on groove portion 93. In this example, a cover 95 is installed such that cover 95 closes carrying port 95 and a circumferential edge thereof faces and contacts sealing member 94, and a communicating path 96 is provided to allow internal atmospheres of groove portion 93 and processing chamber 91 to communicate with each other.

Figure 28:
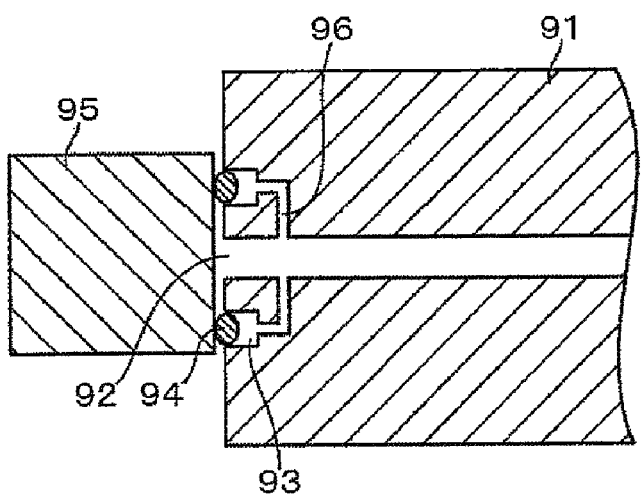
FIG. 28 is a longitudinal cross-sectional side view illustrating the vicinity of the carrying port of the processing container as shown in FIG. 27.

In this case, when the pressure in processing chamber 91 becomes high, sealing member 94 is pressed toward cover 95 and a gap between groove portion 98 and cover 95 may be airtightly closed. In this case, in the case where a restriction mechanism using a lock plate is used, as shown in FIG. 28, when the pressure in processing chamber 91 becomes high, a gap between cover 95 and groove portion 98 is formed. However, since sealing member 94 is pressed to cover 95 to close the gap, the gap between groove portion 93 and cover 95 may be airtightly closed. When the pressure of processing chamber 91 is reduced, pressed sealing member 94 is released, such that sealing member 94 returns to an original position, and thus, is prevented from being caught in the gap.

Wafer holder 21 and cover 7 may be separately installed. For example, after wafer holder 21 is installed in processing chamber 2 in advance and wafer W is carried thereto, carrying port 31 may be closed by cover 7.

In the above configuration, the sealing member of the present disclosure need not be an elastic body, and may be made of stainless steel, titanium and a special alloy. Even in this case, when the pressure in a processing container is boosted, the sealing member is pressurized by the internal atmosphere of the processing container through the communicating path to be pressed toward the cover, such that the gap between the groove portion and the cover is airtightly closed, thereby ensuring airtightness of the processing container. Since the sealing member does not slide with respect to the processing container or the cover, the generation of particles is suppressed.

Next, a second exemplary embodiment related to another supercritical processing apparatus (processing apparatus) will be described with reference to FIGS. 29 to 32. The processing apparatus according to the second exemplary embodiment has substantially the same entire configuration as that described with reference to FIGS. 1 to 4. However, the processing apparatus of the second exemplary embodiment is different from the processing apparatus according to the aforementioned exemplary embodiments (hereinafter, collectively referred to as the first exemplary embodiment) in that carrying port forming member 3 or concave portion forming member 4 for forming groove portion 5 where sealing member 6 is disposed is not provided, and a longitudinal cross section of sealing member 62 is formed in a U shape.

Figure 29:
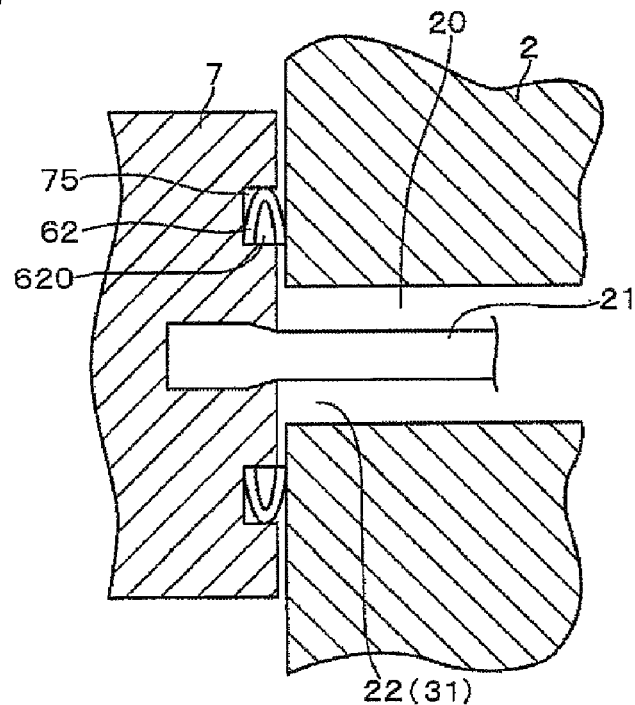
FIG. 29 is a first longitudinal cross-sectional side view illustrating the vicinity of an opening of a processing container according to a second exemplary embodiment of the present disclosure.
Figure 30:
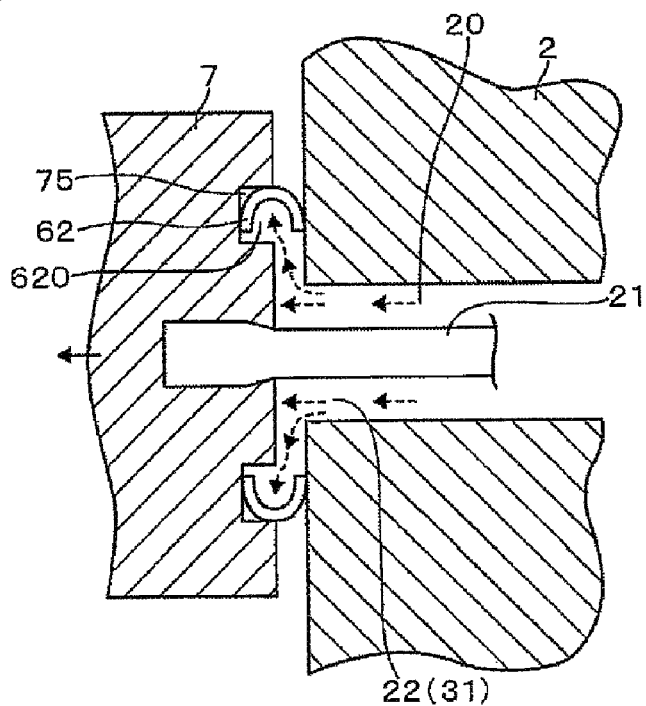
FIG. 30 is a second longitudinal cross-sectional side view illustrating the vicinity of the opening.

As shown in FIGS. 29 and 30, a concave portion 75 is formed at, for example, a side wall of a cover 7 of the processing apparatus according to the second exemplary embodiment to surround a base end of a wafer holder 21. A sealing member 62 is inserted into concave portion 75 to be disposed on a side wall surface of a cover 7 side that contacts a side wall surface around an opening 22. As described above, in processing chamber 2 in this example, since carrying port forming member 3 or concave portion forming member 4 is not installed, opening 22 of processing chamber 2 corresponds to a carrying port 31 of wafer W. Among the elements as shown in FIGS. 29 to 34, the common elements with those of the processing apparatus as shown in FIGS. 1 to 28 are denoted by common reference numerals with those denoted in the figures.

Figure 31:
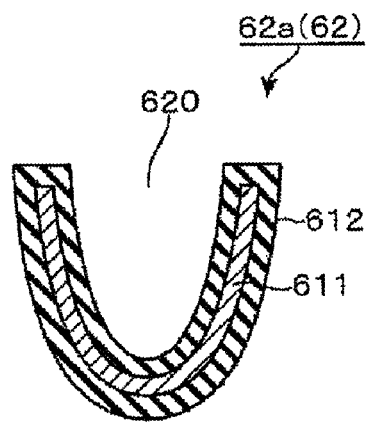
FIG. 31 is a longitudinal cross-sectional side view illustrating a first configuration example of a sealing member having a U-shaped notched portion.
Figure 32:
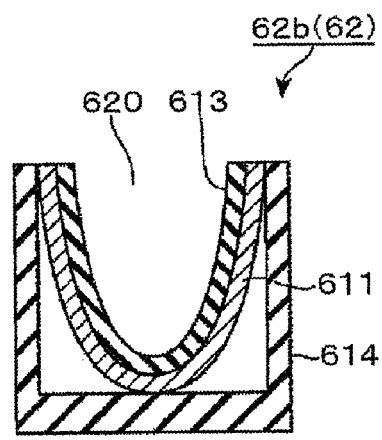
FIG. 32 is a longitudinal cross-sectional side view illustrating a second configuration example of the sealing member.

Sealing member 62 shares similarity with sealing member 6 according to the first exemplary embodiment as shown in FIG. 7 in that sealing members are annularly formed so as to surround opening 22. Meanwhile, as shown in FIGS. 31 and 32, a cross section thereof is formed in a U shape. In sealing member 62 shown in FIGS. 29 and 30, a U-shaped notched portion 620 is formed along an inner circumferential surface of annular sealing member 62. In other words, in sealing member 62, a U-shaped surrounded internal space (notched portion 620) is formed.

When carrying port 31 is closed by cover 7 provided with sealing member 62, sealing member 62 is disposed between facing surfaces of cover 7 and processing chamber 2 so as to close a gap between cover 7 and carrying port 31. Since the gap is formed around opening 22 of processing space 20 in processing chamber 2, a notched portion formed along the inner circumferential surface of sealing member 62 communicates with corresponding processing space 20.

Even in this example, sealing member 62 with notched portion 620 communicating with processing space 20 is exposed to an atmosphere of the supercritical IPA and in some cases, the supercritical IPA elutes a component such as a resin or rubber or impurities contained therein. Therefore, in sealing member 62 in the example, at least the inside of notched portion 620 opened toward processing space 20 is made of a resin having corrosion resistance to the supercritical IPA.

Examples of the resin having corrosion resistance to the supercritical IPA include polyimide, polyethylene, polypropylene, para-xylene and polyether ether ketone (PEEK), and a non-fluorinated resin may be used because the non-fluorinated resin has little effect on a semiconductor device even though a small amount of component is eluted in the supercritical IPA.

A sealing member 62a as shown in FIG. 31 is obtained by forming a polyimide film 612 on the surface of a core 611 made of metal such as stainless steel, nickel, Inconel (registered trademark) and copper, which is formed in substantially the same shape as that of corresponding sealing member 62a (annular shape of the outer appearance and U shape of the longitudinal cross section). Polyimide film 612 may be formed by, for example, vacuum deposition of forming polyimide film 612 on the surface of corresponding core 611 by supplying monomeric vapor, which is a raw material of polyimide, into a vacuum container in which core 611 is disposed and heating core 611 at a temperature at which a polymerization reaction progresses. Polyimide film 612 may be formed by coating a liquid of polyimide material on the surface of core 611, followed by heating. As metal constituting core 611, superelastic metal (metal having a high elastic modulus) such as a Ni—Ti alloy may be used. A superelastic alloy, for example, a Ni—Ti alloy may be restored even though about 8% of Ni—Ti alloy is deformed.

In a sealing member 62b as shown in FIG. 32, a polyimide film 613 is formed only on a surface on which a notched portion 620 of a core 611 is formed, and core 611 with polyimide film 613 has a structure in which core 611 is inserted into a concave portion formed on a guide member 614 made of, for example, polytetrafluoroethylene (PTFE).

Similar to sealing members 62a and 62b, the inside of notched portion 620 opened toward processing space 20 is made of the resin having high corrosion resistance, thereby preventing deterioration in sealing members 62a and 62b. Core 611, or polyimide films 612, 613 have elasticity so as to be deformed in a direction of opening and closing notched portion 620. Sealing member 62 of FIGS. 29 to 30, and 33 and 34 are shown by simplified structures of sealing members 62a, 62b as shown in FIGS. 31 and 32.

Hereinafter, an operation of the processing apparatus including sealing member 62 will be described. The process up to where after wafer W cleaned in a cleaning apparatus (not shown) is carried with the surface thereof adhered with liquid IPA and transferred to wafer holder 21, and cover 7 is moved to carry wafer W in processing chamber 2, is the same as the process in the processing apparatus according to the first exemplary embodiment.

In this case, in processing chamber 2, since carrying port forming member 3 or concave portion forming member 4 is not installed, as shown in FIG. 29, side wall surfaces of cover 7 and processing chamber 2 directly face each other to squash sealing member 62, thereby airtightly closing the periphery of carrying port 31. Sealing member 62 squashed by cover 7 and processing chamber 2 is deformed in a direction in which notched portion 620 becomes narrow. When notched portion 620 is not completely closed, the atmosphere in processing space 20 is introduced into notched portion 620 through a gap between cover 7 and processing chamber 2.

Thereafter, when supercritical IPA is supplied to processing space 20 before the IPA adhered to the surface of wafer W is dried, cover 7 retreats by a gap 24a between an insertion hole 24 formed on a protruding portion 23 and a lock plate 15 due to the pressure applied from the supercritical IPA. By the retreat of cover 7, when the gap between cover 7 and processing chamber 2 is widened, notched portion 620 is expanded by the restoring force of sealing member 62 having elasticity, and as shown in FIG. 30, the atmosphere of processing space 20 (supercritical IPA) is introduced even into notched portion 620 (internal space).

When the supercritical IPA is introduced into notched portion 620, sealing member 62 is widened from the inside of notched portion 620, such that force of pressing an outer circumferential surface of sealing member 62 (opposite surface to notched portion 620) toward a surface of a concave portion 75 side of cover 7 and a side wall surface of processing chamber 2 is applied. Accordingly, the outer circumferential surface of sealing member 62 is brought in close contact with cover 7 or processing chamber 2, thereby airtightly closing a gap between members 7 and 2. It was verified that this kind of sealing member 62 has elasticity to be deformed by the force applied from the supercritical IPA and may maintain a state of airtightly closing the gap against a pressure difference between processing space 20 and the outside (for example, about 4 to 10 MPa).

Since, in sealing member 62, that the surface inside notched portion 620 where the supercritical IPA is introduced is made of a resin having corrosion resistance to the supercritical IPA, the eluted resin component or impurities is small and a sealing function may be maintained over a long period of time. An operation of drying wafer W, after the supercritical IPA is supplied into processing space 20 and then liquid IPA of the surface of wafer W is substituted with the supercritical IPA, or an operation of carrying out wafer W after processing, are the same as those of the first exemplary embodiment, and thus, the description thereof is omitted.

Herein, sealing member 62 is not limited to the case where sealing member 62 is installed at the cover 7 side. In the example as shown in FIGS. 29 and 30, a concave portion may be provided on a side wall surface of processing chamber 2 and sealing member 62 may be inserted into the concave portion.

Sealing member 62 is not limited to the case where sealing member 62 is disposed between the opposite surfaces of cover 7 and carrying port 61.

Figure 33:
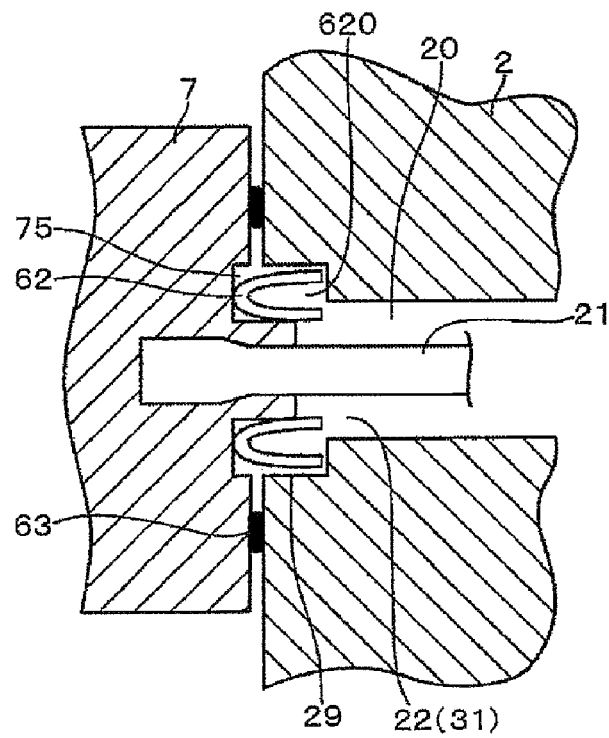
FIG. 33 is a first longitudinal cross-sectional side view according to a modified example of the second exemplary embodiment.
Figure 34:
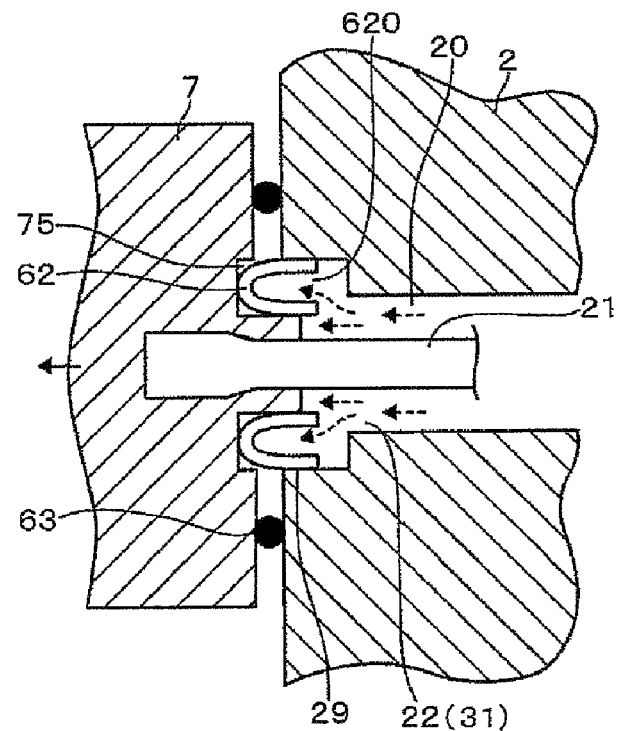
FIG. 34 is a second longitudinal cross-sectional side view according to the modified example.

For example, in the processing apparatus as shown in FIGS. 33 and 34, when opening 22 is closed by cover 7, sealing member 62 is disposed along an inner circumferential surface of the opening. Notched portion 620 of sealing member 62 is opened inward when seen from the cover 7 side and directly communicates with processing space 20 without passing through the gap between cover 7 and processing chamber 2 (FIG. 33).

In the processing apparatus in the example, when the supercritical IPA is supplied to processing chamber 20 after wafer W is carried in processing chamber 2, cover 7 retreats by the aforementioned gap 24a due to the pressure applied from the supercritical IPA, and the supercritical IPA (atmosphere of processing space 20) is introduced into notched portion 620 opened toward processing space 20. The supercritical IPA introduced into notched portion 620 widens sealing member 62 from the inside of notched portion 620 vertically, such that the force of pressing an outer circumferential surface of sealing member 62 toward an inner circumferential surface of opening 22 of processing chamber 2 is applied.

Accordingly, the outer circumferential surface of sealing member 62 is brought in close contact with processing chamber 2 to cover the gap formed between cover 7 and processing chamber 2, thereby airtightly closing the gap. Reference numeral 29 denotes a contact surface for easily bringing the outer circumferential surface of sealing member 62 in close contact by partially notching a circumferential edge of opening 22 and reference numeral 63 denotes an O-ring which is preliminarily installed between cover 7 and processing chamber 2. These elements are installed as necessary.

The shape of notched portion 620 formed on sealing member 62 is not limited to a U shape, but may be a V shape or a concave shape as long as the force of pressing sealing member 62 to cover 7 or processing chamber 2 may be applied by introducing the supercritical IPA into notched portion 620. The "U shape" described in the present disclosure refers to a concept including even a longitudinal cross-sectional shape such as the V shape or the concave shape. Metallic core 611 as shown in FIGS. 31 and 32 may be omitted and sealing member 62 may be constituted by only an elastic body such as a resin.

Figure 35:
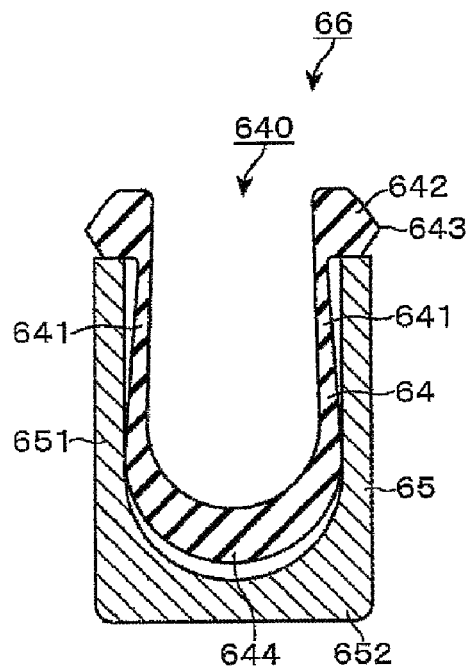
FIG. 35 is a longitudinal cross-sectional side view of a sealing member according to a third exemplary embodiment.

Next, a configuration of a supercritical processing apparatus (processing apparatus) according to a third exemplary embodiment of the present disclosure will be described with reference to FIGS. 35 and 36. The entire configuration of the processing apparatus according to the third exemplary embodiment is substantially the same as that described with reference to FIGS. 1 to 4. As shown in FIG. 35, the processing apparatus of the example shares similarity with sealing members 62a, 62b according to the second exemplary embodiment in that the processing apparatus includes a sealing member 64 that is annularly formed to surround opening 22 of processing chamber 2, has a U-shaped longitudinal cross section, and has a U-shaped surrounded notched portion (640: internal space).

Both ends of a U-shaped part of sealing member 64 are curved outward to form curved end portions 642. Curved end portion 642 tapers outward such that curved end portion 642 contacts processing chamber 2 or cover 7 through an elongated linear area at a front end 643 thereof.

Hereinafter, in the U-shaped longitudinal cross section of sealing member 64, assuming that facing portions are lateral portions 641 and a portion of connecting lateral portions 641 is a connection portion 644, sealing member 64 tapers (becomes thinner) toward curved end portions 642 from connection portion 644, and both lateral portions 641 are inclined inward (toward notched portion 540) toward front ends (toward curved end portions 642).

Sealing member 64 is made of a resin which is an elastic body having corrosion resistance to the supercritical IPA, for example, a resin selected from a resin group consisting of polyimide, polyethylene, polypropylene, para-xylene and polyether ether ketone (PEEK), and prevents impurities from being eluted in the supercritical IPA.

On sealing member 64, a cover member 65 is installed to cover corresponding sealing member 64 from the outside of the U-shaped part when seen from a longitudinal cross section. Cover member 65 serves to restrict deformation of sealing member 64 when the supercritical IPA is introduced into notched portion 640, and thus, sealing member 64 is pressed from the inside.

Cover member 65 is annularly formed as sealing member 64, a longitudinal cross section thereof is formed in a U shape, and sealing member 64 is inserted into U-shaped notched portion (internal space). Hereinafter, even in the U-shaped longitudinal cross section of cover member 65, facing portions are referred to as lateral portions 651, and a portion of connecting lateral portions 651 is referred to as a connection portion 652.

A gap is formed between inner surfaces of lateral portions of cover member 65 and outer surfaces of lateral portions 641 of sealing member 64 inclined inward, and lateral portions 641 of sealing member 64 may be deformed in cover member 65 using the gap as a margin. The inner surfaces of lateral portions 651 of cover member 65 are formed in a shape in which the inner surfaces may contact the outer surfaces of the lateral portions of sealing member 64 by surface contact.

Curved end portions 642 are pushed out to the outside of cover member 65 with sealing member 64 inserted into cover member 65. When the pressure is not applied into notched portion 640, front ends 643 of curved end portions 642 are positioned outside further than the outer surfaces of lateral portions 651 of cover member 65. A gap is formed between an inner surface of connection portion 652 of cover member 65 and an outer surface of connection portion 644 of sealing member 64 and serves as a space for absorbing expansion of sealing member 64 due to heat and the like.

Curved end portions 642 of sealing member 64 contact ends of lateral portions 651 of cover members 65 to cover the ends and support sealing member 64 to prevent the gap between connection portions 644 and 652 from being closed by pressing sealing member 64 into cover member 65 by pressurization from the inside of sealing member 64. In sealing member 64 of the example, outer surfaces of base end sides of lateral portions 651 contact the inner surface of cover member 65 and on the contact surface, sealing member 64 is held in cover member 65. As described above, since lateral portions 641 of sealing member 64 are deformed or thermally expanded in cover member 65, a contact portion between sealing member 64 and cover member 65 may not be fixed by bonding and the like so as not to inhibit the deformation or expansion.

Cover member 65 is made of a material which is not easily deformed as compared to sealing member, for example, metal such as stainless steel, tungsten (W), titanium (Ti), or an alloy containing the metal.

Hereinafter, sealing member 64 and cover member 65 covering sealing member 64 are collectively referred to as a sealing portion 66.

Figure 36:
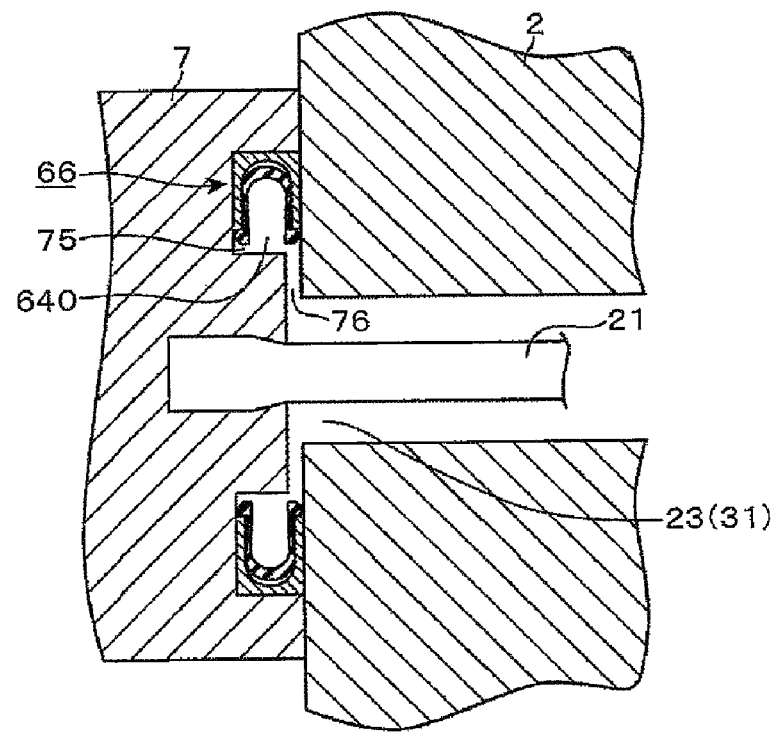
FIG. 36 is a longitudinal cross-sectional side view illustrating the vicinity of an opening of a processing container provided with the sealing member as shown in FIG. 35.

As shown in FIG. 36, sealing portion 66 is inserted into a concave portion 75 that is installed in a processing apparatus, for example, at a side wall of a cover 7 so as to surround a base end of a wafer holder 21. Therefore, when opening 22 is closed by cover 7, sealing portion 66 is disposed between side wall surfaces of processing chamber 2 and cover 7 so as to surround opening 22 of processing chamber 2. In sealing portion 66, a notched portion 640 of sealing member 64 is disposed toward opening 22, and a gap 76 is formed between the side wall surfaces of processing chamber 2 and cover 7 which are surrounded by sealing portion 66. As a result, notched portion 640 (internal space) of sealing member 64 communicates with an internal atmosphere of processing chamber 2.

Figure 37:
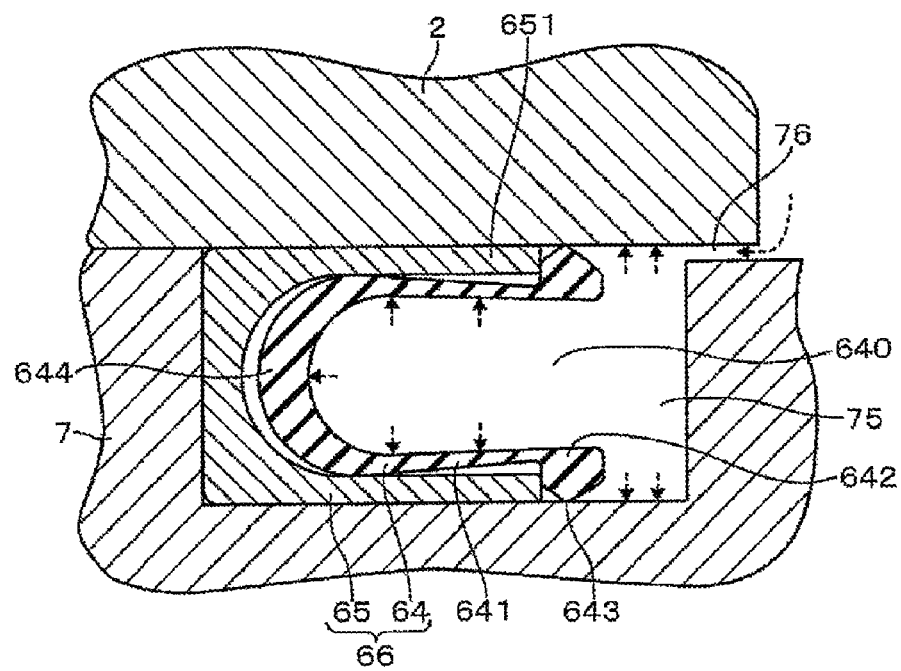
FIG. 37 is a first explanatory view showing the operation of the processing container as shown in FIG. 36.
Figure 38:
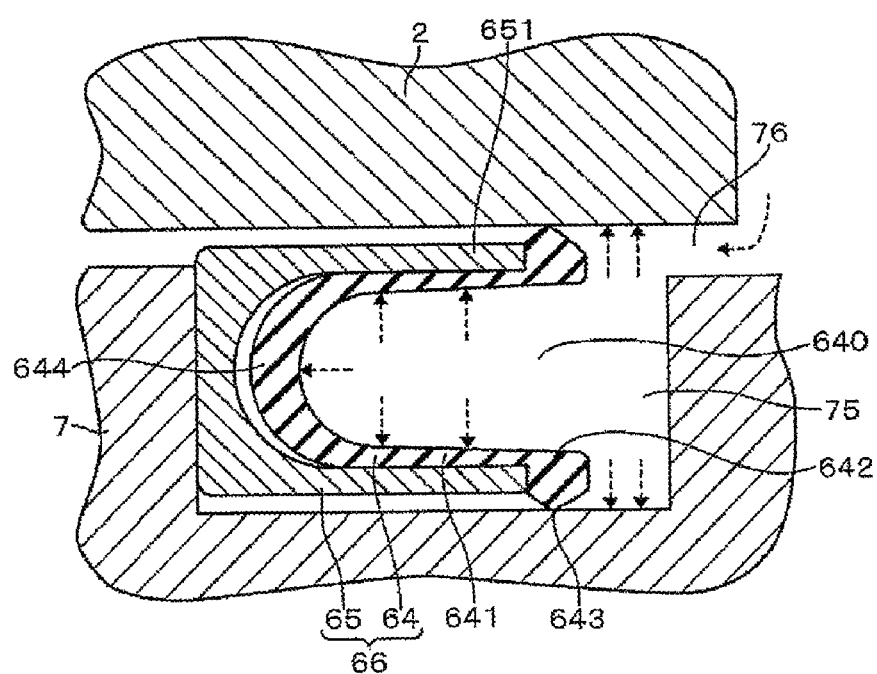
FIG. 38 is a second explanatory view showing the operation of the processing container as shown in FIG. 36.

Among the elements as shown in FIGS. 36 to 38, the common elements with those of the processing apparatus as shown in FIGS. 1 to 28 are denoted by common reference numerals with those denoted in the figures.

Hereinafter, an operation of the processing apparatus including sealing member 66 will be described. When wafer W adhered with liquid IPA after cleaning is carried in processing chamber 2 while being held on wafer holder 21, the side wall surfaces of cover 7 and processing chamber 2 directly face each other.

In this case, as shown in the enlarged view of FIG. 37, the side wall surfaces of cover 7 and processing chamber 2 contact curved end portions 642 protruding outside further than cover member 65, respectively, such that lateral portions 641 of sealing member 64 are deformed to be restored inward. Restoring force is applied to lateral portions 641, which are an elastic body, in an opposite direction to a return direction to press front ends 643 of curved end portions 642 toward cover 7 and processing chamber 2. Consequently, gap 76 between cover 7 and processing chamber 2 may be airtightly closed by sealing member 64.

Thereafter, when the supercritical IPA is supplied to processing chamber 20 before the IPA adhered to the surface of wafer W is dried, the supercritical IPA in processing chamber 2 enters into notched portion (640: internal space) of sealing member 64 through gap 76. While relatively low pressure at which cover 7 is maintained in a contacted state with processing chamber 2, for example, the pressure in processing chamber 2 or notched portion 640 is increased up to about 1 MPa, lateral portions 641 of sealing member 64 are pressurized to be deformed outward, such that curved end portions 642 are pressed to the side wall surfaces of cover 7 and processing chamber 2 by more powerful force.

When the pressure in processing chamber 2 or notched portion 640 is further increased and for example, the pressure exceeds 1 MPa, cover 7 starts to return up to a restriction location by lock plate 15, and thus, gap 76 between processing chamber 2 and cover 7 is widened as shown in FIG. 38. By the movement, lateral portions 641 of sealing member 64 pressurized by the supercritical IPA in notched portion 640 are also widened outward and curved end portions 642 are pushed out up to the outside of cover member 65 to maintain a contacted state with cover 7 or processing chamber 2. Herein, in an example as shown in FIG. 38, due to the stress applied to sealing member 64 resulting from the deformation of lateral portions 641, cover member 65 moves in concave portion 75 of cover 7.

Thus, when lateral portions 641 of sealing member 64 become deformed outward, after a while, the outer surfaces of lateral portions 641 of sealing member 64 contact the inner surfaces of later portions 651 of cover member 65 to restrict the deformation of sealing member 64. As described above, a width of the gap between lateral portions 641, 651 of sealing member 64 and cover member 65 or a curved width of curved end portions 642 (a width protruding outward) is designed such that when sealing member 64 is deformed up to a restriction location restricted by cover member 65, gap 76 between cover 7 retreating up to a restriction location by lock plate 15 and processing chamber 2 may be maintained in an airtightly closed state. The relationship between the pressure in notched portion 640 and a deformation amount of lateral portions 641 may be adjusted by changing thicknesses of lateral portions 641 which become thinner toward curved end portions 642 from a connection portion 644 side.

Even though the supercritical fluid is introduced into notched portion 640, and thus, a differential pressure between the internal space of notched portion 640 and the outside is increased up to about 10 MPa, excessive deformation or occurrence of a crack of lateral portions 641 of sealing member 64 is prevented by restricting the deformation of sealing member 64 by cover member 65. Meanwhile, connection portion 644 of sealing member 64 is thicker than lateral portions 641, and as a result, even though the gap absorbing thermal expansion is formed between sealing member 64 and cover member 65, the strength of sealing member 64 is maintained, thereby preventing unnecessary deformation or the occurrence of a crack.

Since sealing member 64 is made of a resin having corrosion resistance to the supercritical IPA, the eluted resin component or impurity is small and the sealing function may be maintained over a long period of time. Since curved end portions 642 of sealing member 64 are pushed outside to cover the ends of lateral portions 651 of cover member 65, cover member 65 is maintained in a non-contacted state with the supercritical IPA and the metal of cover member 65 is prevented from being corroded.

In the third exemplary embodiment, an operation of drying wafer W after the supercritical IPA is supplied into processing space 20 and then liquid IPA of the surface of wafer W is substituted with the supercritical IPA, or an operation of carrying out wafer W after processing, are the same as those of the first exemplary embodiment, and thus, the description thereof is omitted.

Sealing portion 66 is not limited to the case where sealing portion 66 is installed at the cover 7 side, but the concave portion may be provided at the side wall surface of processing chamber 2 and sealing member 62 may be inserted into the concave portion, which are the same as sealing member 62 of the second exemplary embodiment.

Even in the disclosure according to the third exemplary embodiment, a "U shape" described in the present disclosure refers to a concept including even a longitudinal cross-sectional shape such as a V shape or a concave shape.

In the processing apparatuses according to the first to third exemplary embodiments described above, the material of the high-pressure fluid used to dry wafer W is not limited to IPA and for example, an inert gas such as hydrofluoroether (HFE), carbon dioxide ($CO_2$), nitrogen ($N_2$) and argon (Ar) may also be used. The high-pressure fluid state is not limited to the supercritical state, but the liquid of material is in a subcritical state (for example, in the case of IPA, within a temperature range of 100° C. to 300° C. and a pressure range of 1 MPa to 3 MPa) and the case of drying wafer W using the subcritical fluid is also included in the technical scope of the present disclosure. After carrying in wafer W by wafer holder 21 in processing chamber 2 which is substantially horizontally installed, processing chamber 2 may be substantially vertically inclined and the supercritical processing may be performed in the vertical state.

The supercritical processing performed in the present disclosure is not limited to only the drying processing of removing the liquid of the surface of wafer W. For example, the present disclosure may also be applied to processing of removing a resist film from wafer W by bringing wafer W after performing patterning using the resist film in contact with a supercritical fluid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
a processing container configured to receive a substrate to be processed through a carrying port and process the substrate using a high-pressure fluid;
a cover configured to close the carrying port with a first gap formed between the cover and the processing container when the high-pressure fluid is not supplied to the processing container, and retreat from the processing container by an internal atmosphere of the processing container when the high-pressure fluid is supplied to the processing container thereby widening the first gap;
a sealing member annularly installed to surround the carrying port or fit to an inner circumferential surface of the carrying port when the carrying port is closed by the cover, having an elasticity with a U-shaped longitudinal cross section, and disposed such that an internal space surrounded in the U shape communicates with the internal atmosphere of the processing container;
a restriction mechanism configured to restrict the cover from retreating by the pressure beyond a predetermined position in the processing container,
wherein the restriction mechanism includes:
a lock plate configured to move vertically between a locking position for pressing the cover and an opening location where the lock plate retreats downward from the locking location in order to open the cover and restrict a movement of the cover;
an insertion hole where the lock plate is inserted into the insertion hole; and
an elevating mechanism configured to move the lock plate, and
wherein a second gap is formed between the insertion hole and the lock plate disposed at the locking location by the predetermined position; and
a controller configured to control an overall operation of the processing apparatus,
wherein the controller is programmed such that, when the high-pressure fluid is not supplied to the processing container, the cover airtightly closes the first gap by squashing the sealing member, and
wherein the controller is further programmed such that, when the high-pressure fluid is supplied to the processing container, the sealing member is pressurized by the internal atmosphere of the processing container caused by the high-pressure fluid entering into the internal space surrounded in the U shape through the widened first gap to be pressed to at least one of the cover or the processing container, thereby a state where airtightly closing the first gap widened by the internal atmosphere of the processing container is maintained while the high-pressure fluid is being supplied.

2. The processing apparatus of claim 1, wherein a surface contacting the internal space of the sealing member is made of a resin selected from a resin group consisting of polyimide, polyethylene, polypropylene, para-xylene and polyether ether ketone.

3. A processing apparatus comprising:
a processing container configured to receive a substrate to be processed through a carrying port and process the substrate using a high-pressure fluid;
a cover configured to close the carrying port with a first gap formed between the cover and the processing container when the high-pressure fluid is not supplied to the processing container, and retreat from the processing container by an internal atmosphere of the processing container when the high-pressure fluid is supplied to the processing container thereby widening the first gap;
a sealing member formed of an elastic body annularly installed to surround the carrying port when the carrying port is closed by the cover, having an elasticity with a U-shaped longitudinal cross section, and having both ends of a U-shaped part which are curved outward to form curved end portions, and disposed such that an internal space surrounded in the U shape communicates with the internal atmosphere of the processing container;
a cover member configured to cover the sealing member from the outside of the U-shaped part when seen from a longitudinal cross section of the sealing member in order to restrict deformation of the sealing member;
a restriction mechanism configured to restrict the cover from retreating by the pressure beyond a predetermined position in the processing container,
wherein the restriction mechanism includes:
a lock plate configured to move vertically between a locking position for pressing the cover and an opening location where the lock plate retreats downward from the locking location in order to open the cover and restrict a movement of the cover;
an insertion hole where the lock plate is inserted into the insertion hole; and
an elevating mechanism configured to move the lock plate, and
wherein a second gap is formed between the insertion hole and the lock plate disposed at the locking location by the predetermined position; and
a controller configured to control an overall operation of the processing apparatus,
wherein the controller is programmed such that, when the high-pressure fluid is not supplied to the processing container, the curved end portions are brought in contact with the processing container allowing the cover to airtightly close the first gap, and as the pressure in the processing container is increased to widen the first gap by supplying the high-pressure fluid to the processing container, the sealing member is pressed and deformed in the cover member by the internal atmosphere of the processing container caused by the high-pressure fluid entering into the internal space surrounded in the U shape through the widened first gap allowing the curved end portions to be widened outward to maintain the first gap widened by the internal atmosphere of the processing container in an airtightly closed state while the high-pressure fluid is being supplied.

4. The processing apparatus of claim 3, wherein the sealing member is made of a resin selected from a resin group consisting of polyimide, polyethylene, polypropylene, para-xylene and polyether ether ketone.

5. A processing apparatus comprising:
a processing container configured to receive a substrate to be processed through a carrying port and process the substrate using a high-pressure fluid;
a groove portion annularly formed to surround the carrying port;
a sealing member installed in the groove portion along the groove portion;
a cover configured to close the carrying port with a first gap formed between the cover and the processing container and having a circumferential edge which faces and contacts the sealing member thereby airtightly closing the first gap, and retreat from the processing container by an internal atmosphere of the processing container when the high-pressure fluid is supplied to the processing container thereby widening the first gap;
a communicating path configured to allow the internal atmosphere of the groove portion and the processing container to communicate with each other;
a restriction mechanism configured to restrict the cover from retreating by the pressure beyond a predetermined position in the processing container,
wherein the restriction mechanism includes:
a lock plate configured to move vertically between a locking position for pressing the cover and an opening location where the lock plate retreats downward from the locking location in order to open the cover and restrict a movement of the cover;
an insertion hole where the lock plate is inserted into the insertion hole; and
an elevating mechanism configured to move the lock plate, and
wherein a second gap is formed between the insertion hole and the lock plate disposed at the locking location by the predetermined position; and
a controller configured to control an overall operation of the processing apparatus,
wherein the controller is programmed, when the high-pressure fluid is supplied to the processing container, the sealing member is pressurized by the internal atmosphere of the processing container caused by the high-pressure fluid through the communicating path to be pressed to the cover in order to maintain a state where the cover airtightly closes the first gap widened by the internal atmosphere of the processing container while the high-pressure fluid is being supplied.

6. The processing apparatus of claim 5, wherein the cover is configured such that a part of the cover enters into the groove portion along the groove portion with the carrying port closed.

7. The processing apparatus of claim 5, wherein the groove portion is configured in a tapered shape such that a space in the groove portion is gradually widened in a carrying-in direction of the substrate to be processed from the cover side.

8. The processing apparatus of claim 5, wherein a concave portion is provided in the processing container, and an opening for carrying the substrate to be processed in and out of the processing container is formed on the bottom of the concave portion, and the processing apparatus includes an annular carrying port forming member which is disposed in the concave portion, forms the carrying port continuous with the opening, and has the groove portion formed between an outer circumferential surface thereof and an inner circumferential surface of the concave portion.

9. The processing apparatus of claim 5, wherein an annular carrying port forming member is provided to be movable in a carrying-in direction of the substrate to be processed with respect to the concave portion.

10. The processing apparatus of claim 1, wherein the elasticity of the sealing member with a U-shaped longitudinal cross section is set such that a state of airtightly closing the first gap formed between the cover and the processing container is maintained against a pressure difference of about 4 MPa to about 10 MPa.

11. The processing apparatus of claim 3, wherein the elasticity of the sealing member with a U-shaped longitudinal cross section is set such that a state of airtightly closing the first gap formed between the cover and the processing container is maintained against a pressure difference of about 4 MPa to about 10 MPa.

12. The processing apparatus of claim 5, wherein the elasticity of the sealing member with a U-shaped longitudinal cross section is set such that a state of airtightly closing the first gap formed between the cover and the processing container is maintained against a pressure difference of about 4 MPa to about 10 MPa.

* * * * *